United States Patent
Hamashima et al.

(10) Patent No.: US 9,414,046 B2
(45) Date of Patent: Aug. 9, 2016

(54) IMAGE SENSOR, IMAGING DEVICE AND IMAGE PROCESSING DEVICE

(71) Applicant: NIKON CORPORATION, Tokyo (JP)

(72) Inventors: Muneki Hamashima, Fukaya (JP); Kiyoshige Shibazaki, Higashimurayama (JP); Susumu Mori, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 308 days.

(21) Appl. No.: 14/204,556

(22) Filed: Mar. 11, 2014

(65) Prior Publication Data

US 2014/0333732 A1 Nov. 13, 2014

Related U.S. Application Data

(63) Continuation of application No. PCT/JP2012/005187, filed on Aug. 17, 2012.

(30) Foreign Application Priority Data

Sep. 14, 2011 (JP) ................................. 2011-201142

(51) Int. Cl.
  *H04N 15/00* (2006.01)
  *H04N 13/02* (2006.01)
  (Continued)

(52) U.S. Cl.
  CPC ............... *H04N 13/021* (2013.01); *G03B 35/10* (2013.01); *H01L 27/14621* (2013.01);
  (Continued)

(58) Field of Classification Search
  CPC ............ H04N 13/0217; H04N 13/021; H04N 13/0228; H04N 13/0282; H04N 13/0257; H01L 27/14621; H01L 27/14623; H01L 27/14625

USPC ............ 348/49, 42, 46, 51, 48; 386/210, 224, 386/227
  See application file for complete search history.

(56) References Cited

U.S. PATENT DOCUMENTS

| | | | |
|---|---|---|---|
| 2010/0220217 A1 | 9/2010 | Yuyama | |
| 2013/0127002 A1* | 5/2013 | Okigawa | H01L 27/14627 257/432 |
| 2014/0176682 A1* | 6/2014 | Iwasaki | G02B 7/28 348/49 |

FOREIGN PATENT DOCUMENTS

| | | |
|---|---|---|
| JP | A-5-145859 | 6/1993 |
| JP | A-8-47001 | 2/1996 |

(Continued)

OTHER PUBLICATIONS

International Search Report issued in International Patent Application No. PCT/JP2012/005187 dated Nov. 6, 2012 (with translation).
(Continued)

*Primary Examiner* — Robert Chevalier
(74) *Attorney, Agent, or Firm* — Oliff PLC

(57) ABSTRACT

To obtain image data including a parallax in the vertical direction and image data including a parallax in the horizontal direction, it has been necessary to prepare imaging devices individually at the positions corresponding to the respective viewpoints. Hence, provided is an image processing element including: photoelectric converting elements that are arranged two-dimensionally and convert incident light to electric signals, respectively; and aperture masks provided on the photoelectric converting elements, wherein photoelectric converting element groups each including n photoelectric converting elements are arranged cyclically where n is an integer equal to or larger than 4, and apertures in the aperture masks are positioned lopsidedly to be axisymmetric to each other with respect to each of two orthogonal axes defined on the two-dimensional arrangement of each photoelectric converting element group.

9 Claims, 18 Drawing Sheets

(51) Int. Cl.
  *H01L 27/146* (2006.01)
  *G03B 35/10* (2006.01)

(52) U.S. Cl.
  CPC ... *H01L 27/14623* (2013.01); *H01L 27/14625* (2013.01); *H04N 13/0217* (2013.01); *H04N 13/0228* (2013.01); *H04N 13/0282* (2013.01); *H04N 13/0257* (2013.01)

(56) References Cited

FOREIGN PATENT DOCUMENTS

| | | |
|---|---|---|
| JP | A-2003-7994 | 1/2003 |
| JP | 2008-015754 A | 1/2008 |
| JP | 2008-211631 A | 9/2008 |
| JP | A-2010-200196 | 9/2010 |

OTHER PUBLICATIONS

International Preliminary Report on Patentability issued in International Patent Application No. PCT/JP2012/005187 dated Mar. 18, 2014.

Aug. 4, 2015 Office Action issued in Japanese Patent Application No. 2013-533471.

* cited by examiner

IMAGE SENSOR, IMAGING DEVICE AND IMAGE PROCESSING DEVICE The contents of the following Japanese and PCT patent applications are incorporated herein by reference:
NO. 2011-201142 filed on Sep. 14, 2011, and
NO. PCT/JP2012/005187 filed on Aug. 17, 2012.

BACKGROUND

1. Technical Field

The present invention relates to an image sensor, an imaging device, and an image processing device.

2. Related Art

A stereo imaging device is known which uses two image capturing optical systems to capture stereo images consisting of an image for a right eye and an image for a left eye. With the two image capturing optical systems arranged at a certain interval, such a stereo imaging device produces a parallax between two images captured from the same object.

CONVENTIONAL ART DOCUMENT

Patent Document

[Patent Document 1] Japanese Patent Application No. H8-47001

In order to obtain image data including a parallax in the vertical direction and image data including a parallax in the horizontal direction, it has been necessary to prepare imaging devices individually at the positions corresponding to the respective viewpoints.

SUMMARY

An image sensor according to a first aspect of the present invention includes: photoelectric converting elements that are arranged two-dimensionally and photoelectrically convert incident light to electric signals, respectively; and aperture masks provided on the photoelectric converting elements, wherein photoelectric converting element groups each including n photoelectric converting elements are arranged cyclically, where n is an integer equal to or larger than 4, and apertures in the aperture masks are positioned lopsidedly to be axisymmetric to each other with respect to each of two orthogonal axes defined on the two-dimensional arrangement of each photoelectric converting element group.

An image sensor according to a second aspect of the present invention includes: photoelectric converting elements that are arranged two-dimensionally and photoelectrically convert incident light to electric signals, respectively; and aperture masks provided on the photoelectric converting elements, wherein photoelectric converting element groups each including n photoelectric converting elements are arranged cyclically, where n is an integer equal to or larger than 4, and apertures in the aperture masks, when imaginarily brought upon one photoelectric converting element with their positions with respect to corresponding ones of the photoelectric converting elements maintained, are positioned lopsidedly to be axisymmetric to each other with respect to each of two orthogonal axes defined on the photoelectric converting element provided imaginarily.

An imaging device according to a third aspect of the present invention includes: the image sensor described above; a posture detecting section that detects a posture of the image sensor; a control section that, based on the posture detected by the posture detecting section, controls a selecting circuit to select specific ones of the photoelectric converting elements, and controls an adder to add the electric signals from the specific photoelectric converting elements; and an image processing section that processes image signals output from the adder of the image sensor.

An image processing device according to a fourth aspect of the present invention includes: an output image data acquiring section that acquires output image data that is based on the electric signals output from the image sensor described above; an aperture information acquiring section that acquires aperture position information regarding the positions of the apertures of the image sensor; and a parallax image data generating section that generates parallax image data by processing the output image data based on the aperture position information.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

A digital camera according to the present embodiment, which is one form of an imaging device, is capable to generate at a time images of one scene from a plurality of viewpoints. Images captured from different viewpoints will be referred to as parallax images.

Figure 1:
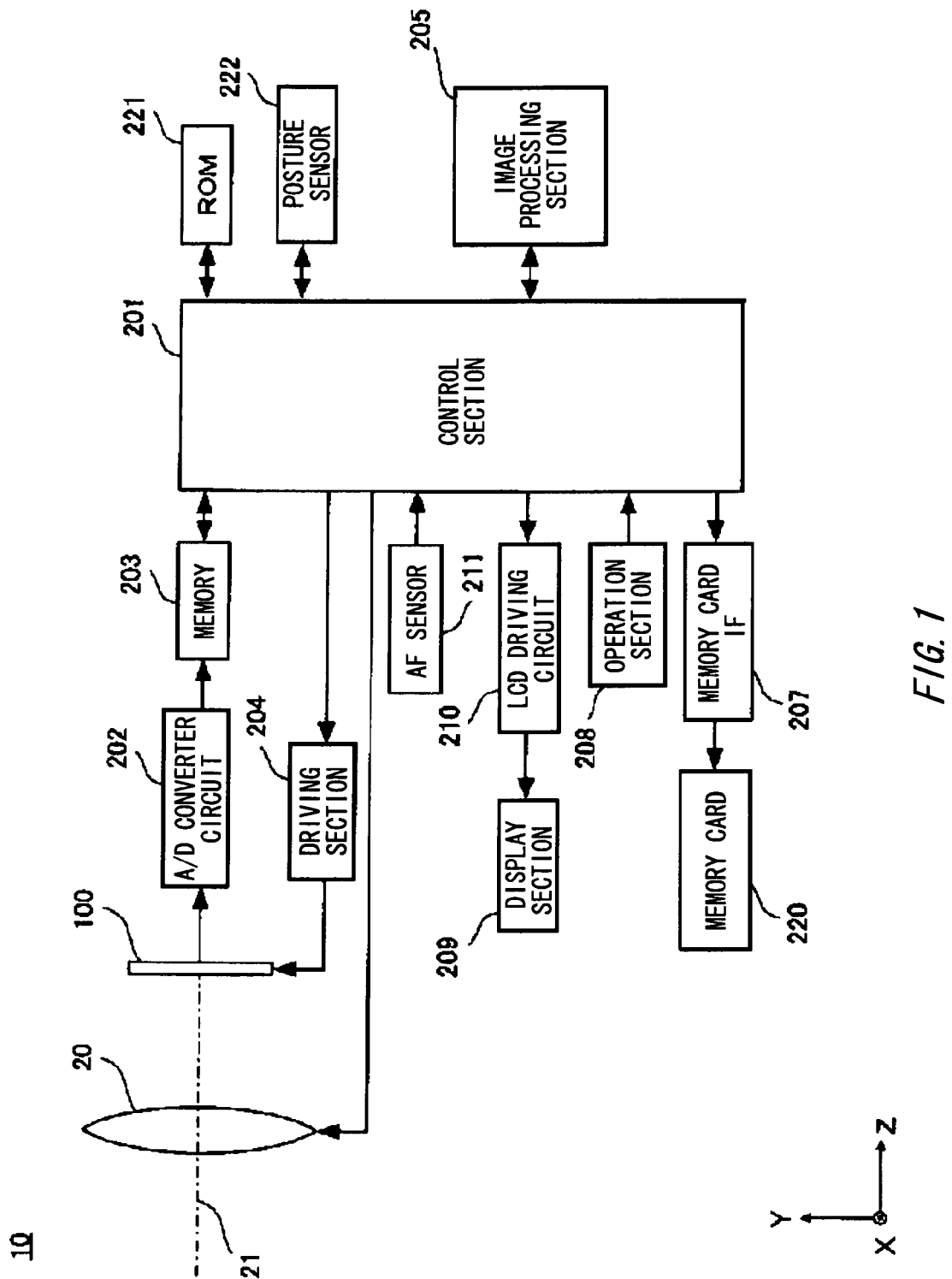
FIG. 1 is a diagram explaining the configuration of a digital camera according to an embodiment of the present invention.

FIG. 1 is a diagram explaining the configuration of a digital camera 10 according to an embodiment of the present invention. The digital camera 10 includes an image capturing lens 20 serving as an image capturing optical system, which guides an incident flux of light from an object to an image sensor 100 along an optical axis 21. The image capturing lens 20 may be a replaceable lens that is detachable from the digital camera 10. The digital camera 10 includes the image sensor 100, a control section 201, an A/D converter circuit 202, a memory 203, a driving section 204, an image processing section 205, a memory card IF 207, an operation section 208, a display section 209, an LCD driving circuit 210, an AF sensor 211, a ROM 221, and a posture sensor 222.

As shown in the drawing, a direction parallel with the optical axis 21 heading for the image sensor 100 is defined as +Z axis direction, a direction coming out from the sheet within a plane perpendicular to the Z axis is defined as +X axis direction, and a direction going upward in the sheet is defined as +Y axis direction. In relation to the image composition, the X axis is the horizontal direction and the Y axis is the vertical direction. In some of the drawings to be described below, the coordinate axes will be drawn to enable the directions of the drawing to be taken hold of based on the coordinate axes of FIG. 1.

The image capturing lens 20 includes a plurality of optical lenses, and forms an image of a flux of light from an object in a scene on about a focal plane thereof. For the expediency of explanation, the image capturing lens 20 is shown in FIG. 1 represented by one virtual lens positioned at about a pupil. The image sensor 100 is positioned at about the focal plane of the image capturing lens 20. The image sensor 100 is an image sensing device such as a CCD, a CMOS sensor, etc. on which a plurality of photoelectric converting elements are arranged two-dimensionally. Under the timing control of the driving section 204, the image sensor 100 converts an object image formed on its light receiving plane to an image signal and outputs it to the A/D converter circuit 202.

The A/D converter circuit 202 converts the image signal output from the image sensor 100 to a digital image signal and outputs it to the memory 203. The image processing section 205 generates image data by carrying out various image processes using the memory 203 as a work space.

The image processing section 205 also has functions for general image processing such as adjustment of image data according to a selected image format. The generated image data is converted to a display signal by the LCD driving circuit 210 and displayed on the display section 209. The generated image data is also recorded on a memory card 220 attached to the memory card IF 207.

The AF sensor 211 is a phase difference sensor having a plurality of ranging points set with respect to an object space, and detects an amount of defocus of an object image at each ranging point. A series of image capturing sequence is started when the operation section 208 receives an operation from a user and outputs an operation signal to the control section 201. Operations such as AF, AE, etc. involved in the image capturing sequence are executed under the control of the control section 201. For example, the control section 201 executes focus control of analyzing a detection signal from the AF sensor 211 and moving a focus lens that constitutes a part of the image capturing lens 20. The ROM 221 is a nonvolatile memory and stores a program for controlling the digital camera 10, various parameters, etc.

Figure 2A:
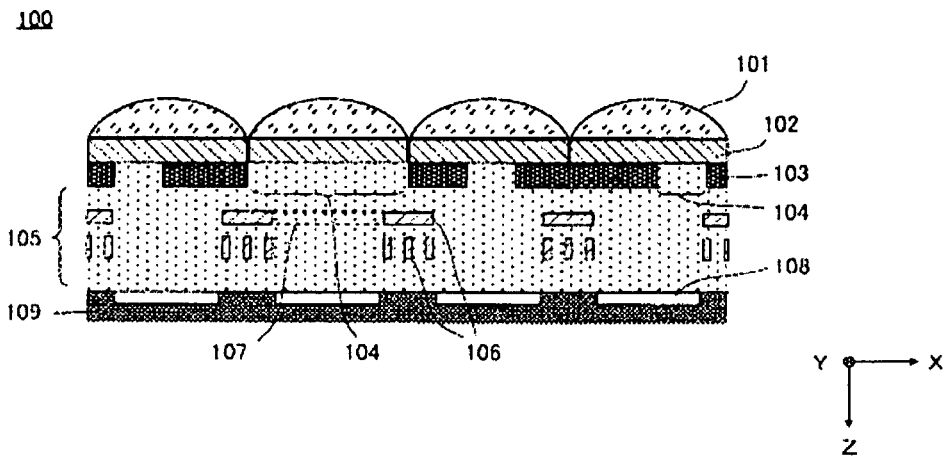
FIG. 2A is a schematic diagram showing a cross-section of an image sensor according to an embodiment of the present invention.
Figure 2B:
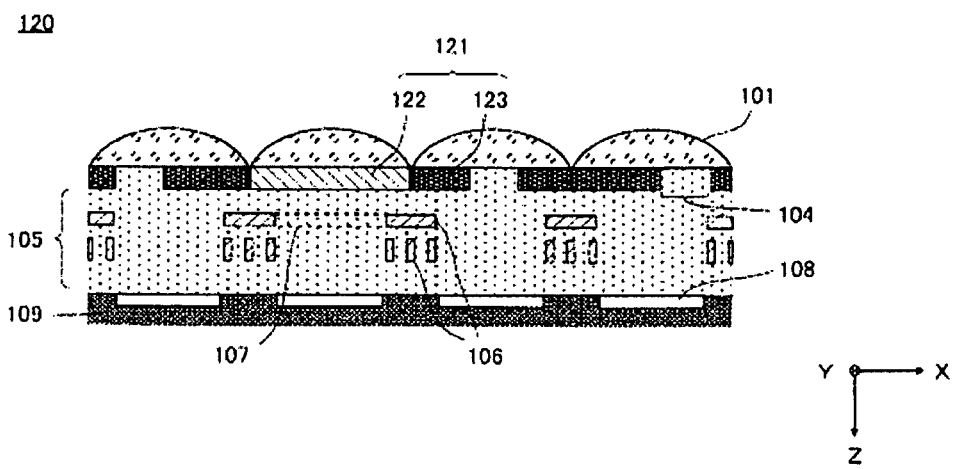
FIG. 2B is a schematic diagram showing a cross-section of an image sensor according to an embodiment of the present invention.

Next, the configuration of the image sensor 100 will be explained in detail. FIG. 2 are schematic diagrams showing cross-sections of the image sensor according to the present embodiment. FIG. 2A is a schematic diagram showing a cross-section of the image capturing section 100 in which color filters 102 and aperture masks 103 are separate components. FIG. 2B is a schematic diagram showing a cross-section of a modified example of the image sensor 100, i.e., an image sensor 120 including a screen filter 121 in which color filter portions 122 and aperture mask portions 123 are integrated.

As shown in FIG. 2A, the image sensor 100 includes from the object side in order, micro-lenses 101, color filters 102, aperture masks 103, an interconnection layer 105, and photoelectric converting elements 108. The photoelectric converting elements 108 are constituted by photodiodes for converting incident light to an electric signal. A plurality of photoelectric converting elements 108 are arranged two-dimensionally on the surface of a substrate 109.

An image signal resulting from the conversion by the photoelectric converting elements 108, a control signal for controlling the photoelectric converting elements 108, etc. are sent and received through interconnection lines 106 provided in the interconnection layer 105. The aperture masks 103 having apertures 104 provided in one-to-one correspondence to the plurality of photoelectric converting elements 108 are provided in contact with the interconnection layer. As will be described later, the apertures 104 are staggered with respect to their corresponding photoelectric converting elements 108 to have strictly-defined relative positions. As will be described in detail later, the aperture masks 103 having these apertures 104 act to produce a parallax in a flux of light from an object to be received by the photoelectric converting elements 108.

On the other hand, a photoelectric converting element 108 for which to produce no parallax has no aperture mask 103 provided thereon. In other words, it can be said that a photoelectric converting element 108 for which to produce no parallax has an aperture mask 103 provided thereon that has an aperture 104 that does not restrict a flux of light from an object to be incident to its corresponding photoelectric converting element 108, i.e., an aperture 104 that allows passage of all fluxes of effective light. The interconnection lines 106, which produce no parallax, can be considered aperture masks that allow passage of all fluxes of effective light in which to product no parallax, because apertures 107 resulting from the formation of the interconnection lines 106 substantially define an incident flux of light from an object. The aperture masks 103 may be arranged individually for the respective photoelectric converting element 108, or may be formed simultaneously for the plurality of photoelectric converting elements 108 like the manufacturing process of the color filters 102.

The color filters 102 are provided on the aperture masks 103. The color filters 102 are filters provided in one-to-one correspondence to the photoelectric converting elements 108 and colored so as to allow a specific wavelength band to transmit to the corresponding photoelectric converting elements 108. In order to output a color image, it is necessary to arrange at least three kinds of color filters different from one another. These color filters can be said to be primary color filters for generating a color image. The combination of primary color filters may include, for example, a red filter that allows a red wavelength band to transmit, a green filter that allows a green wavelength band to transmit, and a blue filter that allow a blue wavelength band to transmit. As will be described later, these color filters are arranged in a lattice formation to match the photoelectric converting elements 108. The combination of color filters may not only be a combination of the primary colors RGB but also be a combination of complementary colors YeCyMg.

The micro-lenses 101 are provided on the color filters 102. The micro-lenses 101 are condensing lenses that guide as much as possible of an incident flux of light from an object to the photoelectric converting elements 108. The micro-lenses 101 are provided in one-to-one correspondence to the photoelectric converting elements 108. It is preferred that in consideration of the relative positional relationship between the center of the pupil of the image capturing lens 20 and the photoelectric converting elements 108, the optical axes of the micro-lenses 101 be staggered such that as much as possible of a flux of light from an object is guided to the photoelectric converting elements 108. Furthermore, the positions of the micro-lenses 101 may be adjusted together with the positions of the apertures 104 of the aperture masks 103 such that as much as possible of a specific flux of light from an object to be described later is incident.

One unit of an aperture mask 103, a color filter 102, and a micro-lens 101 provided in one-to-one correspondence to each photoelectric converting element 108 is referred to as a pixel. Particularly, a pixel including an aperture mask 103 to produce a parallax is referred to as a parallax pixel, and a pixel including no aperture mask 103 to produce a parallax is referred to as a non-parallax pixel. For example, when the effective pixel region of the image sensor 100 is about 24 mm×16 mm, the number of pixels is about 12,000,000.

No micro-lenses 101 need to be provided for an image sensing device having a good condensing efficiency and a good photoelectric converting efficiency. If the image sensing device is a back-side illumination type, the interconnection layer 105 is provided on the opposite side to the photoelectric converting elements 108.

The combination of the color filters 102 and the aperture masks 103 includes many variations. If a color component is provided in the apertures 104 of the aperture masks 103 in FIG. 2A, the color filters 102 and the aperture masks 103 can be formed integrally. When a specific pixel is designated as a pixel to acquire luminance information of an object, this pixel needs to have no corresponding color filter 102. Alternatively, such a pixel may have a non-color transparent filter in order to allow substantially all wavelength bands of the visible light to transmit.

When a pixel to acquire luminance information is a parallax pixel, i.e., when parallax images are output as monochrome images at least once, the composition of an image sensor 120 shown in FIG. 2B can be employed. That is, a screen filter 121 in which color filter portions 122 functioning as color filters and aperture mask portions 123 having apertures 104 are formed integrally may be provided between the micro-lenses 101 and the interconnection layer 105.

The screen filter 121 is formed such that the color filter portions 122 are colored in, for example, blue, green, and red, and the aperture mask portions 123 are colored in black at the mask sections other than the apertures 104. The image sensor 120 employing the screen filter 121 has a shorter distance from the micro-lenses 101 to the photoelectric converting elements 108 than in the image sensor 100, and hence has a higher condensing efficiency for a flux of light from an object.

Figure 3:
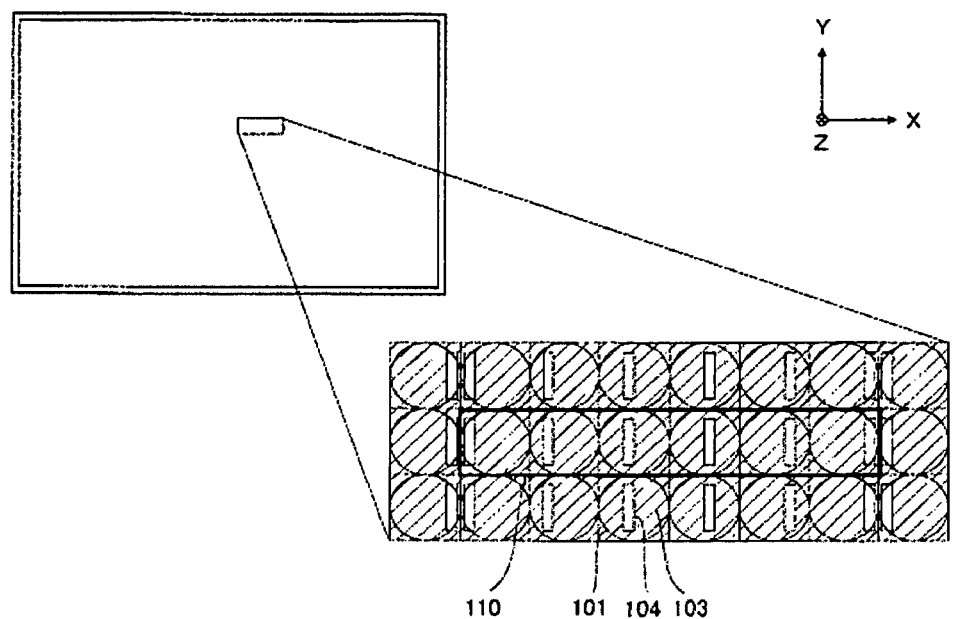
FIG. 3 is a schematic diagram showing an enlarged view of a portion of the image sensor.

Next, the relationship between the apertures 104 of the aperture masks 103 and parallaxes to be produced will be explained. FIG. 3 is a schematic diagram showing an enlarged view of a portion of an image sensor 800. Though different from the image sensor 100 employed in the present embodiment, the image sensor 800 will be explained first for the expediency of explanation. Further, to simplify the explanation, no consideration will be given to the coloring of the color filters 102, until reference to them is resumed later. In the following explanation where no reference is made to the coloring of the color filter 102, the image sensing device can be considered an array of only such parallax pixels that have the color filters 102 of the same color (including the case where the color filters are transparent). Therefore, the repetition pattern to be explained below may be considered adjoining pixels having the color filters 102 of the same color.

As shown in FIG. 3, the apertures 104 of the aperture masks 103 are staggered with respect to the corresponding pixels. Further, the apertures 104 in adjoining pixels are staggered with respect to each other.

In the shown example, there are provided six kinds of aperture masks 103 in which the positions of the apertures 104 with respect to the corresponding pixels are staggered in the X axis direction. There are provided on the entire surface of the image sensor 800 two-dimensionally and cyclically, photoelectric converting element groups each including six parallax pixels including the aperture masks 103 that are gradually staggered from the −X side to the +X side. That is, it is possible to say that the image sensor 800 is configured by cyclically laid repetition patterns 110 each including one photoelectric converting element group.

Figure 4A:
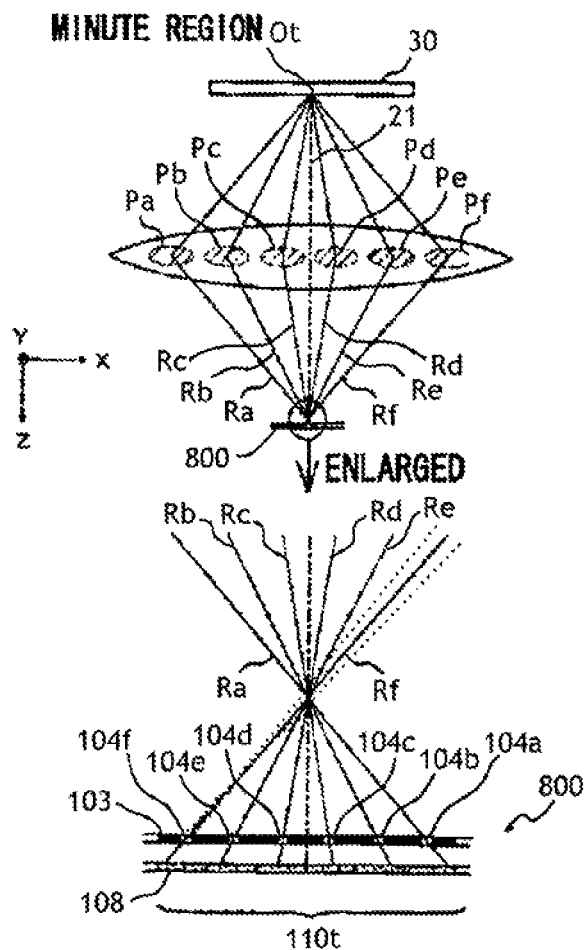
FIG. 4A is a concept diagram explaining a relationship between parallax pixels and an object.
Figure 4B:
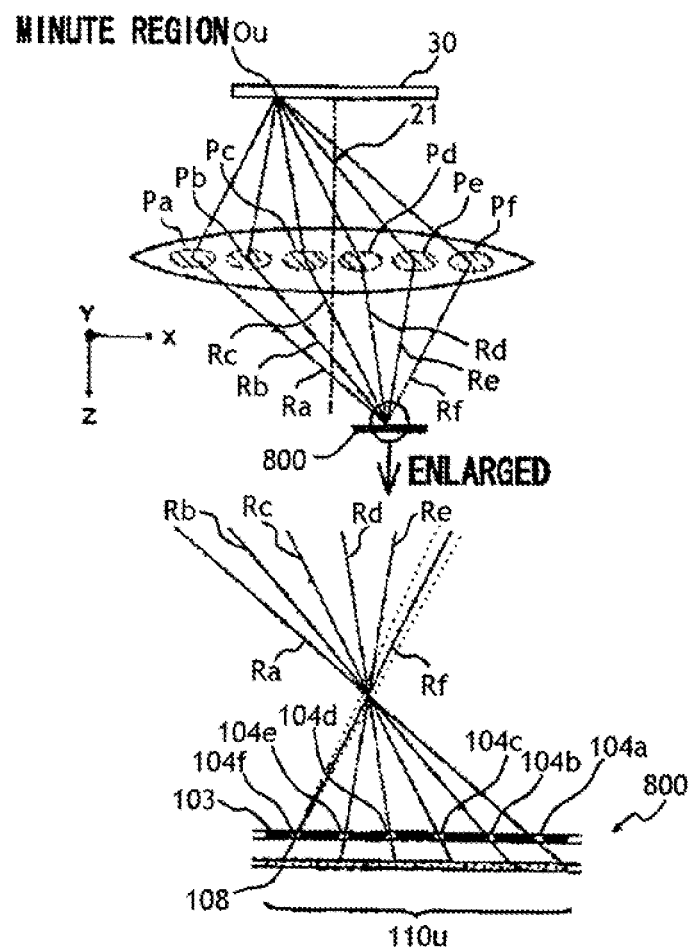
FIG. 4B is a concept diagram explaining a relationship between parallax pixels and an object.
Figure 4C:
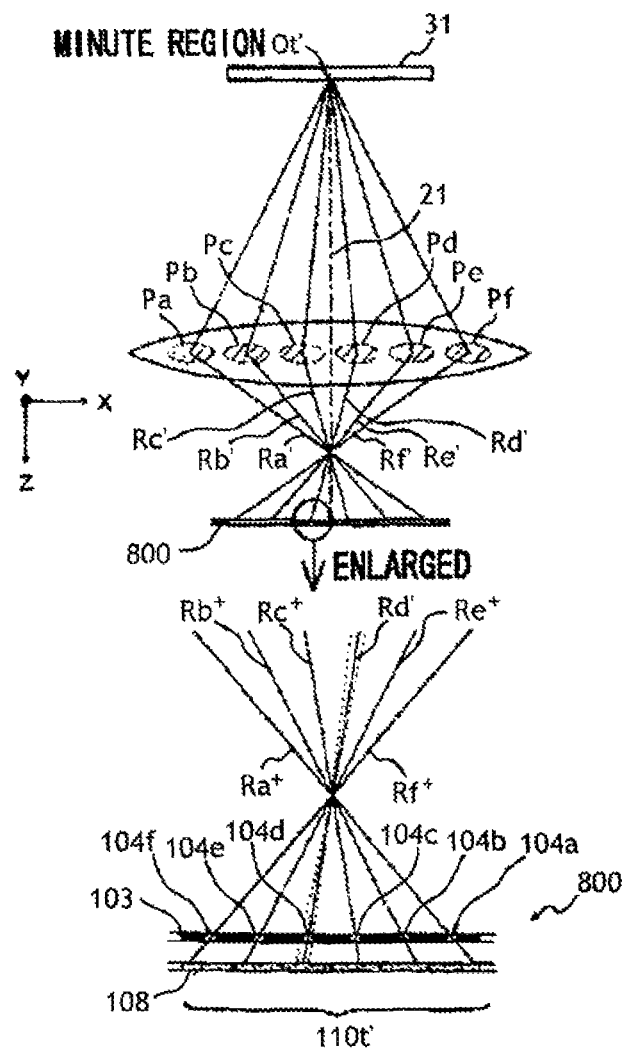
FIG. 4C is a concept diagram explaining a relationship between parallax pixels and an object.

FIG. 4 are concept diagrams explaining the relationship between parallax pixels and an object. Particularly, FIG. 4A shows the photoelectric converting element group of a repetition pattern 110*t* arranged in the center of the image sensor 800 and perpendicular to the image capturing optical axis 21, and FIG. 4B exemplarily shows the photoelectric converting element group of a repetition pattern 110*u* arranged peripherally. An object 30 shown in FIGS. 4A and 4B is located at an in-focus position with respect to the image capturing lens 20. FIG. 4C exemplarily shows the same relationship as in FIG. 4A of a case when an object 31 located at an out-of-focus position with respect to the image capturing lens 20 is captured.

First, the relationship between the parallax pixels and an object will be explained as for a case when the image capturing lens 20 captures the object 30 located at the in-focus position. A flux of light from the object is guided to the image sensor 800 through the pupil of the image capturing lens 20 where six partial regions Pa to Pf are defined on the entire plane of a cross-sectional region to be passed through by the flux of light from the object. For example, as can be understood from the enlarged views, at the pixel at the −X-side end of the photoelectric converting element group constituting the repetition pattern 110*t* or 110*u*, the position of the aperture 104*f* of the aperture mask 103 is defined so as to allow only a flux of light from the object emitted from the partial region Pf to reach the photoelectric converting element 108. Likewise, toward the pixel at the +X-side end, the position of the aperture 104*e* is defined to match the partial region Pe, the position of the aperture 104*d* is defined to match the partial region Pd, the position of the aperture 104*c* is defined to match the partial region Pc, the position of the aperture 104*b* is defined to match the partial region Pb, and the position of the aperture 104*a* is defined to match the partial region Pa, respectively.

In other words, it is possible to say that, for example, the position of the aperture 104*f* is defined by the slope of a principal ray of light Rf of a flux of light from an object emitted through the partial region Pf, where the slope is defined by the relative positional relationship between the partial region Pf and the pixel at the −X-side end. When a flux of light from the object 30 located at the in-focus position is received by the photoelectric converting element 108 through the aperture 104*f*, the image of the flux of light from the object is formed on the photoelectric converting element 108 as shown by the dotted lines. Likewise, toward the pixel at the +X side end, the position of the aperture 104*e* is defined by the slope of a principal ray of light Re, the position of the aperture 104*d* is defined by the slope of a principal ray of light Rd, the position of the aperture 104*c* is defined by the slope of a principal ray of light Rc, the position of the aperture 104*b* is defined by the slope of a principal ray of light Rb, and the position of the aperture 104*a* is defined by the slope of a principal ray of light Ra, respectively.

As shown in FIG. 4A, a flux of light emitted from a minute region Ot of the in-focus object 30 crossing the optical axis 21 passes through the pupil of the image capturing lens 20 and reaches the respective pixels in the photoelectric converting element group constituting the repetition pattern 110*t*. That is, the pixels in the photoelectric converting element group constituting the repetition pattern 110*t* receive fluxes of light emitted from one minute region Ot through the six partial regions Pa to Pf, respectively. The minute region Ot has an area that can absorb any positional misalignment of the pixels in the photoelectric converting element group constituting the repetition pattern 110*t*, but can be substantially approximated by an object point having substantially the same size. Likewise, as shown in FIG. 4B, a flux of light emitted from a minute region Ou of the in-focus object 30 that is off the optical axis 21 passes through the pupil of the image capturing lens 20 and reaches the respective pixels in the photoelectric converting element group constituting the repetition pattern 110*u*. That is, the pixels in the photoelectric converting element group constituting the repetition pattern 110*u* receive fluxes of light emitted from one minute region Ou through the six partial regions Pa to Pf, respectively. Like the minute region Ot, the minute region Ou also has an area that can absorb any positional misalignment of the pixels in the photoelectric converting element group constituting the repetition pattern 110*u*, but can be substantially approximated by an object point having substantially the same size.

That is, where the object 30 is at the in-focus position, the minute regions to be captured by the photoelectric converting element groups vary according to the positions of the repetition patterns 110 on the image sensor 800, and the same minute region is captured through different partial regions by the respective pixels constituting each photoelectric converting element group. Further, the corresponding pixels in different repetition patterns 110 receive fluxes of light from the object through the same partial region. That is, in the drawings, for example, the pixels at the −X-side end of the repetition patterns 110*t* and 110*u* receive fluxes of light from the object through the same partial region Pf.

Strictly speaking, the position of the aperture 104*f* from which the pixel at the −X-side end of the repetition pattern 110*t* arranged in the center and perpendicular to the image capturing optical axis 21 receives a flux of light from the object through the partial region Pf is different from the position of the aperture 104*f* from which the pixel at the −X-side end of the repetition pattern 110*u* arranged peripherally receives a flux of light from the object through the partial region Pf. However, from a functional viewpoint, they can be considered the aperture masks of the same kind because they are aperture masks for receiving fluxes of light from the object through the partial region Pf. Therefore, in the example of FIG. 4, it is possible to say that the parallax pixels arranged on the image sensor 800 each include one of the six kinds of aperture masks.

Next, the relationship between the parallax pixels and an object will be explained as for a case when the image capturing lens 20 captures an object 31 located at an out-of-focus position. Also in this case, a flux of light from the object 31 located at the out-of-focus position passes through the six partial regions Pa to Pf of the pupil of the image capturing lens 20 and reaches the image sensor 800. However, the image of the flux of light from the object 31 located at the out-of-focus position is formed not on the photoelectric converting elements 108 but on another position. For example, as shown in FIG. 4C, when the object 31 is located at a position farther from the image sensor 800 than is the object 30, the image of the flux of light from the object is formed at the object 31 side of the photoelectric converting elements 108. Conversely, when the object 31 is located at a position nearer the image sensor 800 than is the object 30, the image of the flux of light from the object is formed at the side of the photoelectric converting elements 108 opposite to the object 31.

Therefore, a flux of light emitted from a minute region Ot' of the out-of-focus object 31 passes through any of the six partial regions Pa to Pf, and depending of the partial regions passed, reaches corresponding pixels in different repetition patterns 110. For example, as shown in the enlarged view of FIG. 4C, a flux of light from the object passed through the partial region Pd, i.e., a principal ray of light Rd' enters the photoelectric converting element 108 included in the repetition pattern 110*t'* and corresponding to the aperture 104*d*. A flux of light passed through another partial region, even though it has been emitted from the minute region Ot', does not enter the photoelectric converting element 108 included in the repetition pattern 110t', but enters the photoelectric converting element 108 included in another repetition pattern and corresponding to the aperture corresponding to the passed partial region. In other words, fluxes of light from the object to reach the respective photoelectric converting elements 108 constituting the repetition pattern 110t' are fluxes of light emitted from different minute regions of the object 31. That is, a flux of light from the object including the principal ray of light Rd' enters the photoelectric converting element 108 corresponding to the aperture 104d, and fluxes of light from the object including principal rays of light $Ra^+$, $Rb^+$, $Rc^+$, $Re^+$, and $Rf^+$ enter the photoelectric converting elements 108 corresponding to other apertures, and they are fluxes of light emitted from different minute regions of the object 31. Such a relationship is also true in the peripherally arranged repetition pattern 110u shown in FIG. 4B.

That being the case, when the image sensor 800 is taken on the whole, an object image A captured by the photoelectric converting element 108 corresponding to the aperture 104a and an object image D captured by the photoelectric converting element 108 corresponding to the aperture 104d will have no image gap as long as they are images of the object located at the in-focus position, but will have image gap if they are images of the object located at the out-of-focus position. The direction and amount of the image gap are determined depending on to which side of the in-focus position and by how much the out-of-focus object is lopsided and on the distance between the partial region Pa and the partial region Pd. That is, the object image A and the object image D are images having a parallax between them. This relationship is also true for the other apertures, and six images having parallaxes are therefore generated in the X axis direction correspondingly to the apertures 104a to 104f.

Hence, a parallax image is obtained when outputs from corresponding pixels in the respective repetition patterns 110 having the configuration described above are gathered. That is, a parallax image is formed by the outputs from pixels having received fluxes of light from the object that have been emitted through a specific partial region of the six partial regions Pa to Pf.

Figure 5:
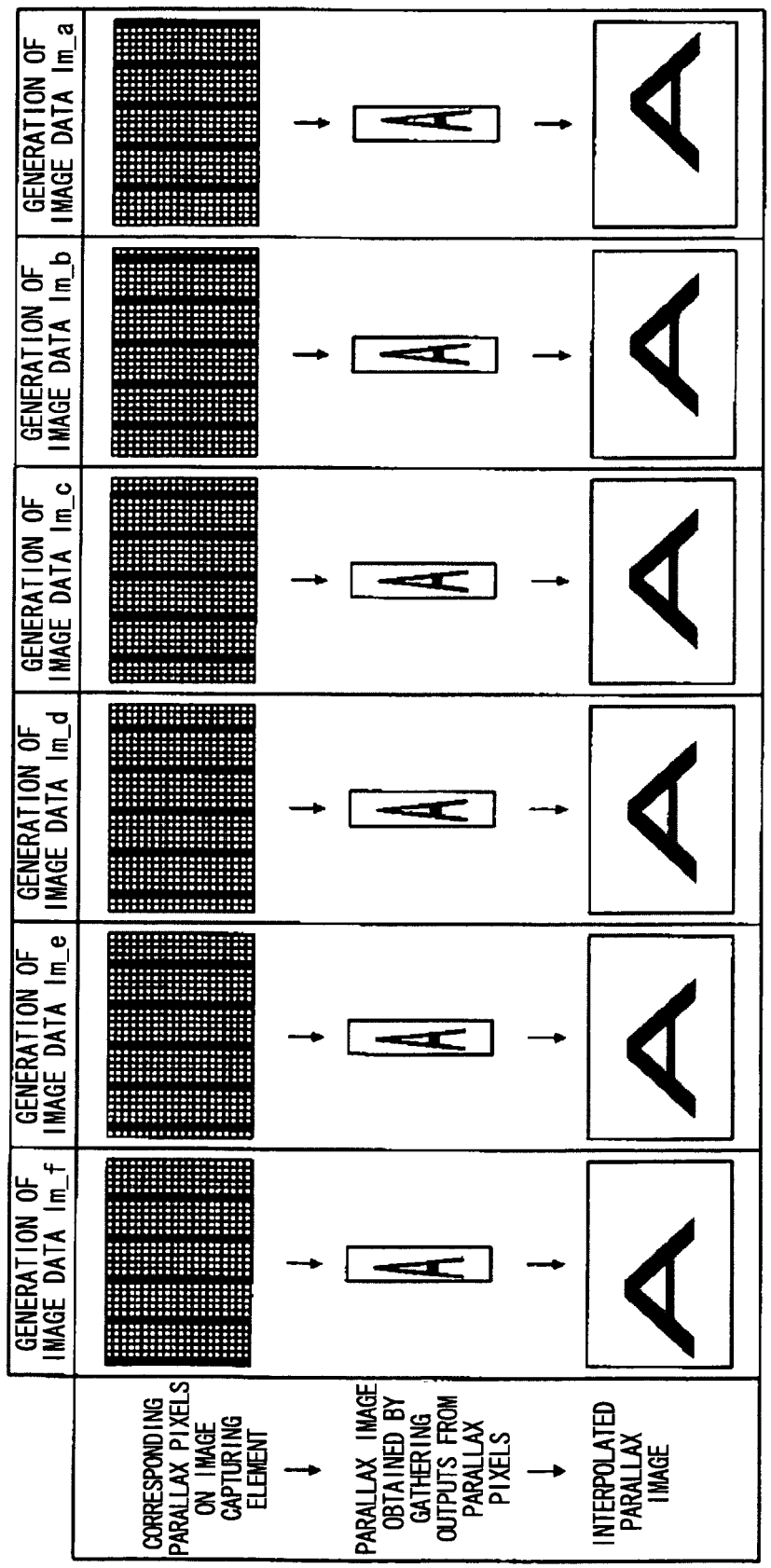
FIG. 5 is a concept diagram explaining a process for generating parallax images.

FIG. 5 is a concept diagram explaining a process for generating parallax images. The drawing shows in order from the column on the left of the sheet, how parallax image data Im_f to be generated by gathering the outputs from parallax pixels corresponding to the apertures 104f is generated, how parallax image data Im_e based on the outputs from the apertures 104e is generated, how parallax image data Im_d based on the outputs from the apertures 104d is generated, how parallax image data Im_c based on the outputs from the apertures 104c is generated, how parallax image data Im_b based on the outputs from the apertures 104b is generated, and how parallax image data Im_a based on the outputs from the apertures 104a is generated. First, how parallax image data Im_f based on the outputs from the apertures 104f is generated will be explained.

The repetition patterns 110 each constituted by a photoelectric converting element group including six parallax pixels are arranged in the X axis direction. Therefore, parallax pixels including the apertures 104f are located on the image sensor 800 at every six pixels in the X axis direction and continuously in the Y axis direction. These pixels receive fluxes of light from the object from different minute regions respectively, as described above. Therefore, when the outputs from these parallax pixels are arranged as gathered, an X axis direction parallax image, i.e., a horizontal parallax image is obtained.

However, because the pixels on the image sensor 800 are square pixels, simply gathering them results in vertically-long image data as the number of pixels in the X axis direction is thinned to ⅙. Hence, interpolation to increase the number of pixels in the X axis direction to six times larger is applied to generate parallax image data Im_f which represents an image having the original aspect ratio. However, because the parallax image data before interpolation is applied is an image thinned to ⅙ in the X axis direction, the resolution in the X axis direction is lower than the resolution in the Y axis direction. That is, the number of pieces of parallax image data to be generated and improvement of the resolution conflict.

Parallax image data Im_e to parallax image data Im_a are generated in the same manner. That is, the digital camera 10 can generate horizontal parallax images of six viewpoints having parallaxes in the X axis direction.

Figure 6:
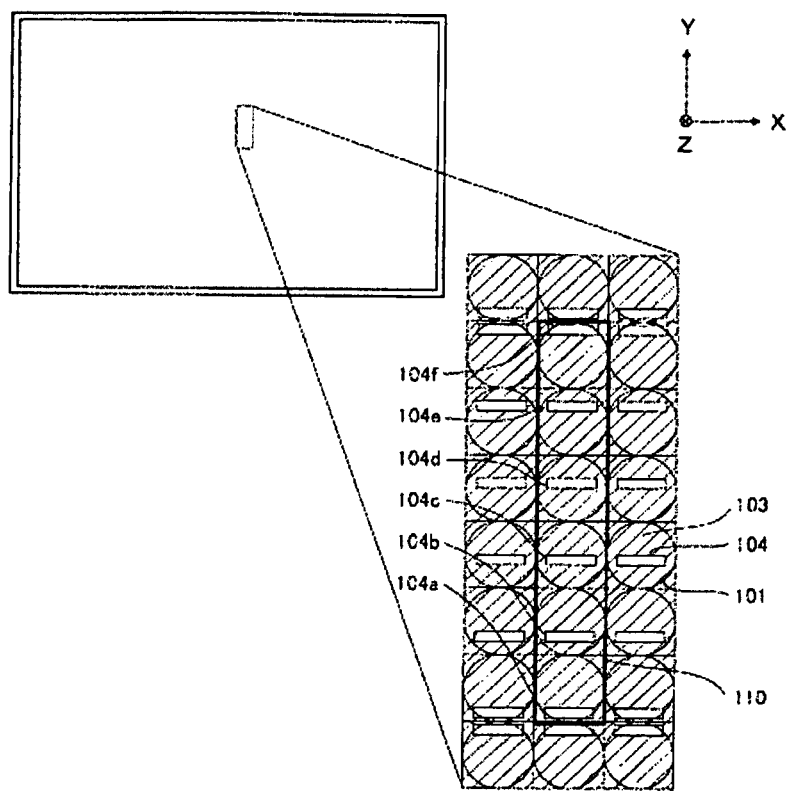
FIG. 6 is a schematic diagram showing an enlarged view of a portion of an image sensor that produces a vertical parallax.

The example explained above is one in which there are cyclically provided the X-direction-extending repetition patterns 110 each constituted by a group of six parallax pixels including aperture masks 103 of which apertures 104 are gradually staggered from the −X side to the +X side. In this case, six parallax images having horizontal parallaxes, which are parallaxes in the X axis direction, are obtained, as explained with reference to FIG. 5. Meanwhile, by changing the direction in which to stagger the apertures 104 and the arrangement of the repetition patterns 110, it is possible to obtain parallax images having vertical parallaxes, which are parallaxes in the Y axis direction. FIG. 6 is a schematic diagram showing an enlarged view of a portion of an image sensor 900 that produces vertical parallaxes.

In the example shown in the drawing, there are provided six kinds of aperture masks 103 in which the positions of the apertures 104 with respect to the corresponding pixels are staggered from one another in the Y axis direction. There are provided on the entire surface of the image sensor 900 two-dimensionally and cyclically, photoelectric converting element groups each including six parallax pixels including the aperture masks 103 that are gradually staggered from the +Y side to the −Y side. That is, it is possible to say that the image sensor 900 is configured by cyclically laid Y direction repetition patterns 110 each including one photoelectric converting element group.

When seen by the repetition pattern 110 unit, the image sensor 900 shown in FIG. 6 has repetition patterns 110 rotated by 90 degrees from the repetition patterns 110 in the image sensor 800 explained with reference to FIG. 3. Therefore, the optical relationships explained with reference to FIG. 4 are also true for the image sensor 900 shown in FIG. 6. That is, six images having parallaxes in the Y axis direction will be formed correspondingly to the apertures 104a to 104f of a repetition pattern 110 extended in the Y axis direction. Therefore, a parallax image having a parallax in the vertical direction is obtained when outputs from corresponding pixels in the respective repetition patterns 110 are gathered.

Figure 7:
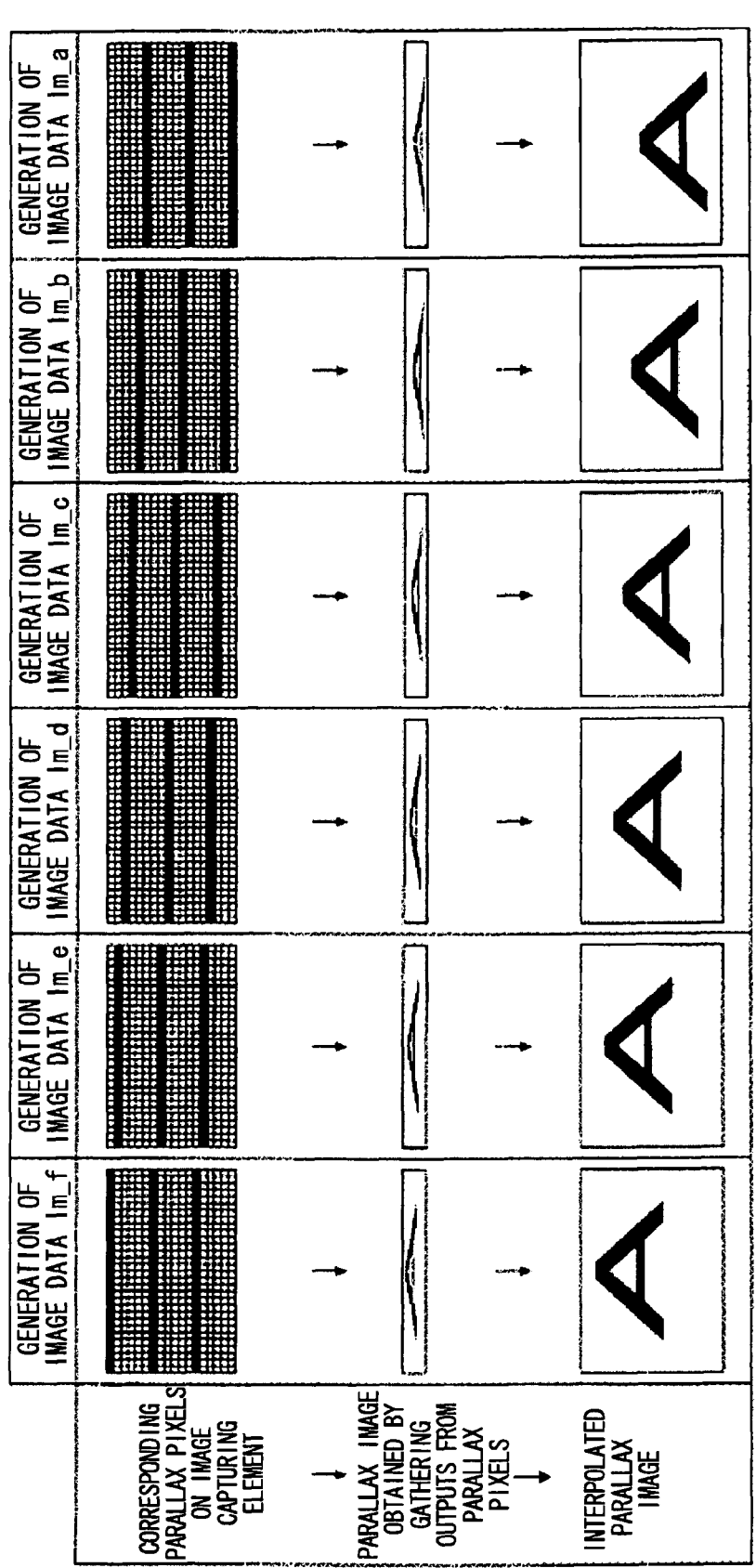
FIG. 7 is a concept diagram explaining a process for generating a Y axis direction parallax images.

FIG. 7 is a concept diagram explaining a process for generating Y axis direction parallax images. The drawing shows in order from the column on the left of the sheet, how parallax image data Im_f to be generated by gathering the outputs from parallax pixels corresponding to the apertures 104f is generated, how parallax image data Im_e based on the outputs from the apertures 104e is generated, how parallax image data Im_d based on the outputs from the apertures 104d is generated, how parallax image data Im_c based on the outputs from the apertures 104c is generated, how parallax image data Im_b based on the outputs from the apertures 104b is generated, and how parallax image data Im_a based on the outputs from the apertures 104a is generated. First, how parallax image data Im_f based on the outputs from the apertures 104f is generated will be explained.

The repetition patterns 110 each constituted by a photoelectric converting element group including six parallax pixels are arranged in the Y axis direction. Therefore, parallax pixels including the apertures 104f are located on the image sensor 900 at every six pixels in the Y axis direction and continuously in the X axis direction. These pixels receive fluxes of light from the object from different minute regions, respectively, as described above. Therefore, when the outputs from these parallax pixels are arranged as gathered, a Y axis direction parallax image, i.e., a vertical parallax image is obtained.

However, because the pixels on the image sensor 900 are square pixels, simply gathering them results in horizontally-long image data as the number of pixels in the Y axis direction is thinned to ⅙. Hence, interpolation to increase the number of pixels in the Y axis direction to six times larger is applied to generate parallax image data Im_f which represents an image having the original aspect ratio. However, because the parallax image data before interpolation is applied is an image thinned to ⅙ in the Y axis direction, the resolution in the Y axis direction is lower than the resolution in the horizontal direction.

Parallax image data Im_e to parallax image data Im_a are generated in the same manner. That is, the digital camera 10 can generate vertical parallax images of six viewpoints having parallaxes in the Y axis direction.

The image sensor 800 shown in FIG. 3 and the image sensor 900 shown in FIG. 6, in which the apertures 104 are staggered in one direction, output a set of parallax images having parallaxes in that direction. However, an image sensor can output a set of parallax images having parallaxes two-dimensionally in the X and Y directions, depending on the arrangement of the repetition patterns 110 and the positions of the apertures 104 in the aperture masks 103 corresponding to the respective photoelectric converting elements 108. The image sensor 100 employed in the present embodiment is an image sensor of this type.

Figure 8:
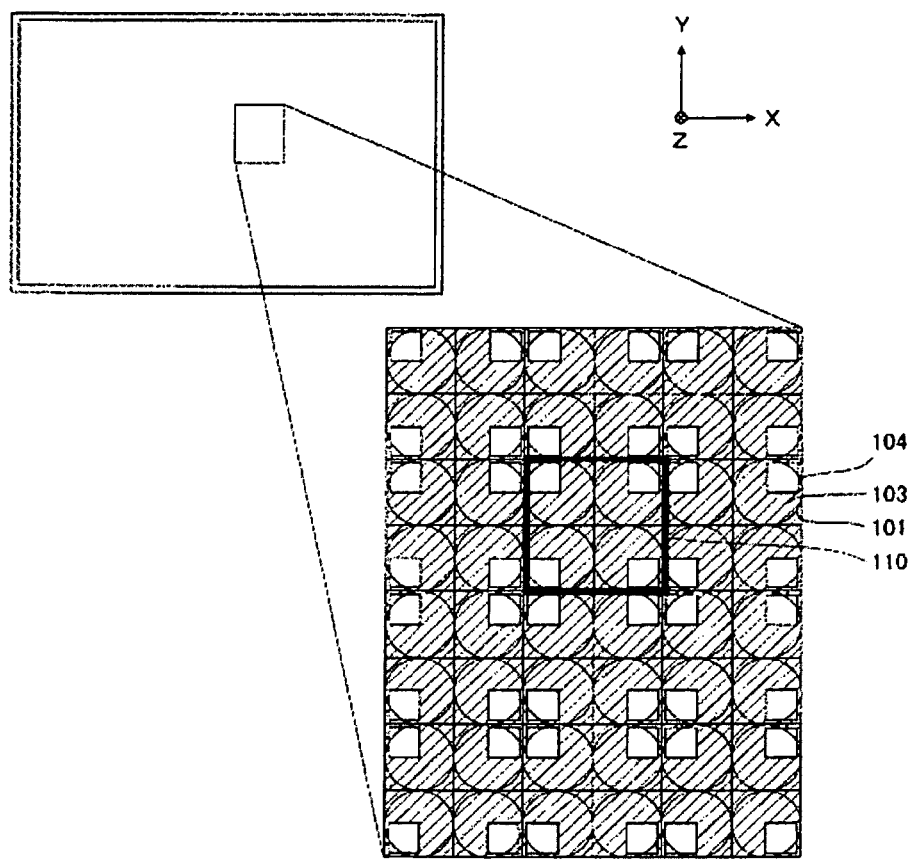
FIG. 8 is a schematic diagram showing an enlarged view of a portion of an image sensor according to an embodiment.

FIG. 8 is a schematic diagram showing an enlarged view of a portion of the image sensor 100 according to the present embodiment. The image sensor 100 is provided with cyclically arranged repetition patterns 110 each including a photoelectric converting element group including four parallax pixels arranged in two rows vertically and in two columns horizontally. The respective parallax pixels included in one repetition pattern 110 include aperture masks 103 having apertures 104 lopsided to different directions.

Figure 9:
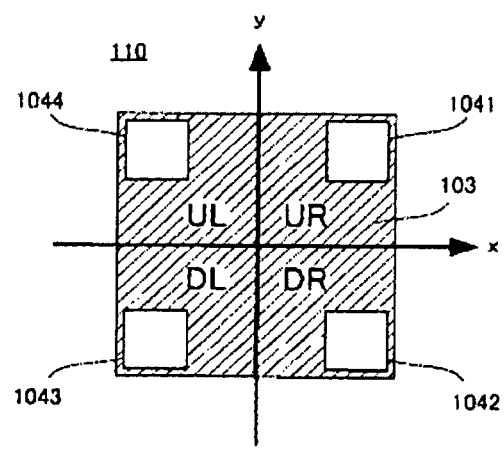
FIG. 9 is a diagram showing a repetition pattern including one photoelectric converting element group.

FIG. 9 is a diagram showing parallax pixels of one repetition pattern 110. The four parallax pixels include an UR pixel arranged on the upper right of the repetition pattern 110, a DR pixel arranged on the lower right thereof, a DL pixel arranged on the lower left thereof, and an UL pixel arranged on the upper left thereof. The UR pixel includes an aperture mask 103 having an aperture 1041 lopsided to the upper right from the pixel center. The DR pixel includes an aperture mask 103 having an aperture 1042 lopsided to the lower right from the pixel center. The DL pixel includes an aperture mask 103 having an aperture 1043 lopsided to the lower left from the pixel center. The UL pixel includes an aperture mask 103 having an aperture 1044 lopsided to the upper left from the pixel center.

These apertures 1041 to 1044 are arranged at positions axisymmetric to each other with respect to an x axis defined as a horizontal axis passing the center of the repetition pattern 110 and a y axis defined as a vertical axis passing the center of the repetition pattern 110. In other words, the apertures 1041 to 1044 are arranged lopsidedly to be axisymmetric to each other with respect to the vertical and horizontal two orthogonal axes defined on the two-dimensional arrangement of the photoelectric converting element group constituting the repetition pattern 110. That is, the pair of apertures 1041 and 1042 are arranged at positions axisymmetric to each other with respect to the x axis and so are the pair of apertures 1044 and 1043, while the pair of apertures 1044 and 1041 are arranged at positions axisymmetric to each other with respect to the y axis and so are the pair of apertures 1043 and 1042.

FIG. 10 is a concept diagram explaining the relationship between the parallax pixels included in the repetition pattern 110 and an object 30. The apertures 1041 to 1044 of the repetition pattern 110 let through partial fluxes of light passed through any of four partial regions defined two-dimensionally on a cross-sectional region of the full flux of light from the object, and guide them to corresponding photoelectric converting elements.

Figure 10A:
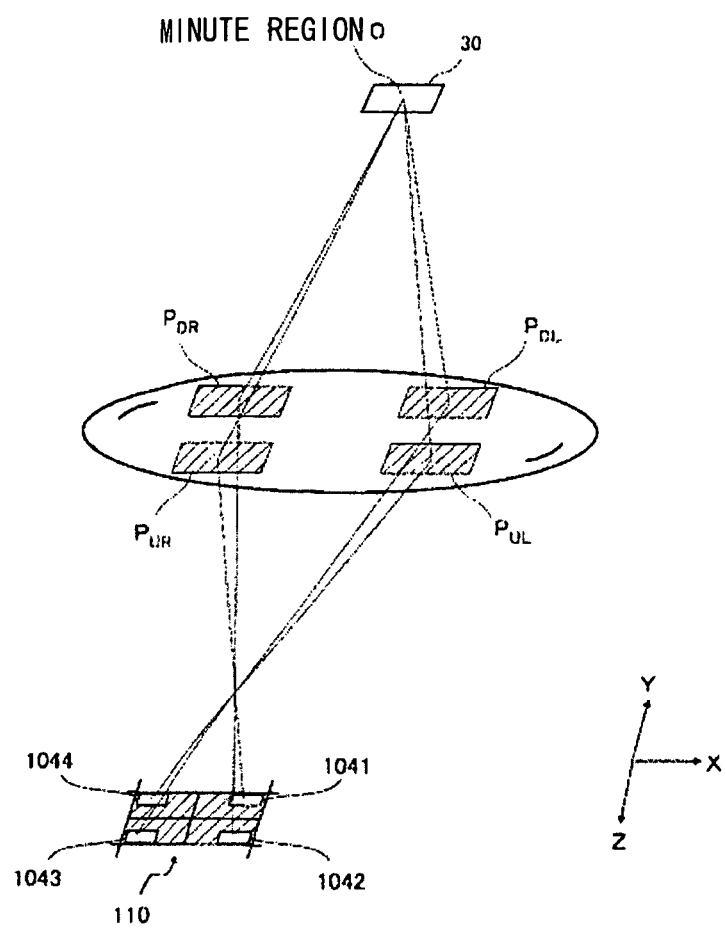
FIG. 10A is a concept diagram explaining a relationship between parallax pixels included in a repetition pattern and an object.

Specifically, as shown in FIG. 10A, for example, the aperture 1041 in the UR pixel lets through only a partial flux of light, included in a flux of light emitted from a minute region O of the object 30, that has passed through a partial region $P_{UR}$ of the pupil of the image capturing lens 20, and guides it to the photoelectric converting element 108 corresponding to the UR pixel. Likewise, the aperture 1042 in the DR pixel lets through only a partial flux of light, included in the flux of light emitted from the minute region O of the object 30, that has passed through a partial region $P_{DR}$ of the pupil of the image capturing lens 20, and guides it to the photoelectric converting element 108 corresponding to the DR pixel. The aperture 1043 in the DL pixel lets through only a partial flux of light, included in the flux of light emitted from the minute region O of the object 30, that has passed through a partial region $P_{DL}$ of the pupil of the image capturing lens 20, and guides it to the photoelectric converting element 108 corresponding to the DL pixel. The aperture 1044 in the UL pixel lets through only a partial flux of light, included in the flux of light emitted from the minute region O of the object 30, that has passed through a partial region $P_{UL}$ of the pupil of the image capturing lens 20, and guides it to the photoelectric converting element 108 of the UL pixel.

Hence, a parallax image is obtained when outputs from corresponding pixels in the respective repetition patterns 110 having the configuration described above are gathered. That is, a parallax image is formed by the outputs from the pixels that have received a flux of light from the object that has been emitted through any of the four partial regions $P_{UR}, P_{DR}, P_{DL}$, and $P_{UL}$.

Figure 10B:
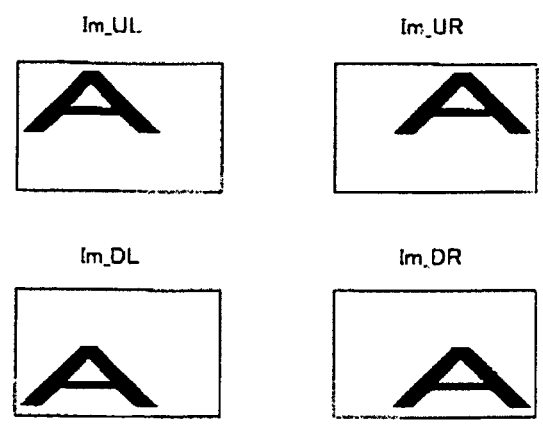
FIG. 10B is a concept diagram explaining a relationship between parallax pixels included in a repetition pattern and an object.

Specifically, the image processing section 205 generates parallax image data Im_UR by gathering outputs from the UR pixels, generates parallax image data Im_DR by gathering outputs from the DR pixels, generates parallax image data Im_DL by gathering outputs from the DL pixels, and generates parallax image data Im_UL by gathering outputs from the UL pixels. When the object is located on the focal plane, the image of the object appears at the same position in the parallax images. On the other hand, when the object is located at a farther position than the focal plane, the image of the object appears at a position lopsided to the upper right in the parallax image data Im_UR, at a position lopsided to the lower right in the parallax image data Im_DR, at a position lopsided to the lower left in the parallax image data Im_DL, and at a position lopsided to the upper left in the parallax image data Im_UL, as shown in FIG. 10B. When the object is located at a nearer position than the focal plane, the image of the object appers at a position lopsided to the lower left in the parallax image data Im_UR, at a position lopsided to the upper left in the parallax image data Im_DR, at a position lopsided to the upper right in the parallax image data Im_DL, and at a position lopsided to the lower right in the parallax image data Im_UL. The number of pixels included in each of the four parallax image data is ¼ of the number of pixels of the whole image, but the aspect ratio thereof is the same as that of the whole image because each parallax image data is generated by gathering any of upper right pixels, lower right pixels, lower left pixels, and upper left pixels having a square shape.

The image generating method shown in FIG. 10B in which the image processing section 205 generates four parallax images by gathering outputs from different kinds of parallax pixels separately is good, but it is better to generate parallax images to match the visual characteristics of a human being, who is the viewer. Specifically, since the eyeballs of a human being are located horizontally on the left and right, it is preferable to provide the parallax images to be viewed with a parallax in the horizontal direction corresponding to the disposition of the eyeballs. Meanwhile, when taking a photo, a user may hold the digital camera 10 at a horizontal angle of view or at a vertical angle of view with respect to the object. Therefore, it is preferable that the parallax image data to be generated by the image processing section 205 produce a parallax in the horizontal direction when viewed, regardless of at which of a horizontal angle of view and a vertical angle of view the image has been captured. Hence, the image sensor 100 according to the present embodiment performs a process of adding parallax pixels in order to output parallax images that will produce a parallax in the direction that matches the visual characteristics described above.

Figure 11A:
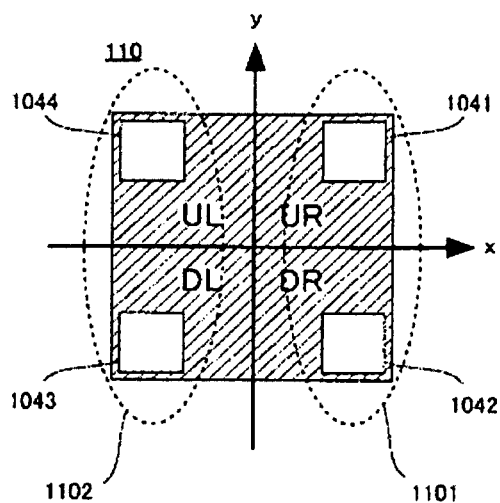
FIG. 11A is a concept diagram explaining a relationship between parallax pixel addition to produce a parallax in a horizontal direction and parallax images to be output.

FIG. 11 are concept diagrams explaining the relationship between parallax pixel addition to produce a parallax in the horizontal direction and parallax images to be output. FIG. 11A is a diagram showing pairs of parallax pixels to be added. When outputting parallax images that will produce a parallax in the horizontal direction, the output from the UR pixel and the output from the DR pixel are added, and the output from the UL pixel and the output from the DL pixel are added. That is, the combination of the UR pixel and the DR pixel and the combination of the UL pixel and the DL pixel are handled as paired pixels, respectively.

Specifically, the combination of the aperture 1041 in the UR pixel and the aperture 1042 in the DR pixel is regarded as one GR aperture 1101 which is lopsided to the right in the repetition pattern 110, to handle the result of addition of outputs from the UR pixel and the DR pixel as if it were an output from one right parallax pixel. Likewise, the combination of the aperture 1044 in the UL pixel and the aperture 1043 in the DL pixel are regarded as one GL aperture 1102 which is lopsided to the left in the repetition pattern 110, to handle the result of addition of outputs from the UL pixel and the DL pixel as if it were an output from one left parallax pixel.

Figure 11B:
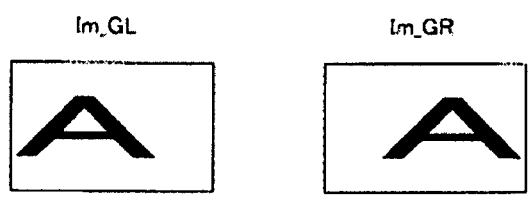
FIG. 11B is a concept diagram explaining a relationship between parallax pixel addition to produce a parallax in a horizontal direction and parallax images to be output.

When outputs from such virtual right parallax pixels and outputs from such virtual left parallax pixels are gathered respectively and interpolation for aspect adjustment is applied, right parallax image data Im_GR and left parallax image data Im_GL representing images that produce a parallax in the horizontal direction as shown in FIG. 11B are obtained. When the user takes a photo by holding the digital camera 10 at a horizontal angle of view and such parallax image data are generated, the images to be reproduced are so-called stereo images that produce a parallax in the horizontal direction.

FIG. 12 are concept diagrams explaining the relationship between parallax pixel addition to produce a parallax in the vertical direction and parallax images to be output. FIG. 12A is a diagram showing pairs of parallax pixels to b added. When outputting parallax images that will produce a parallax in the vertical direction, the output from the UL pixel and the output from the UR pixel are added and the output from the DL pixel and the output from the DR pixel are added. That is, the combination of the UL pixel and the UR pixel, and the combination of the DL pixel and the DR pixel are handled as paired pixels, respectively.

Specifically, the combination of the aperture 1044 in the UL pixel and the aperture 1041 in the UR pixel is regarded as one GU aperture 1103 which is lopsided to the upper side in the repetition pattern 110, to handle the result of addition of outputs from the UL pixel and the UR pixel as if it were an output from one upper parallax pixel. Likewise, the combination of the aperture 1043 in the DL pixel and the aperture 1042 in the DR pixel is regarded as one GD aperture 1104 which is lopsided to the lower side in the repetition pattern 110, to handle the result of addition of outputs from the DL pixel and the DR pixel as if it were an output from one lower parallax pixel.

Figure 12A:
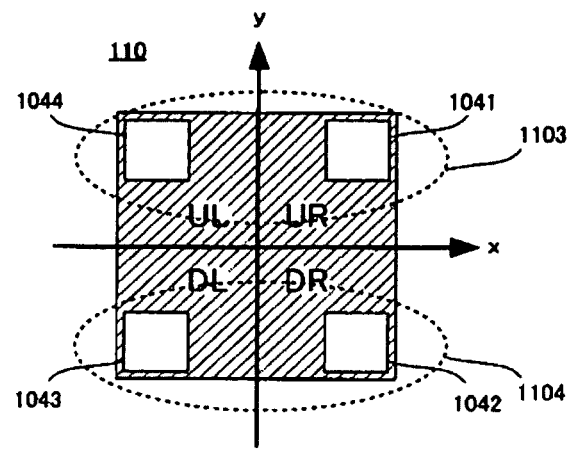
FIG. 12A is a concept diagram explaining a relationship between parallax pixel addition to produce a parallax in a vertical direction and parallax images to be output.
Figure 12B:
FIG. 12B is a concept diagram explaining a relationship between parallax pixel addition to produce a parallax in a vertical direction and parallax images to be output.
Figure 12B:
Figure 12C:
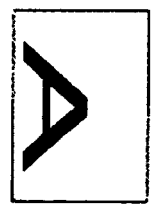
FIG. 12C is a concept diagram explaining a relationship between parallax pixel addition to produce a parallax in a vertical direction and parallax images to be output.
Figure 12C:
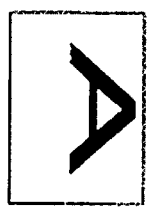

When outputs from such virtual upper parallax pixels and outputs from such virtual lower parallax pixels are gathered respectively and interpolation for aspect adjustment is applied, upper parallax image data Im_GU and lower parallax image data Im_GD representing images that produce a parallax in the vertical direction as shown in FIG. 12B are obtained. However, when the user takes a photo by holding the digital camera 10 at a vertical angle of view, these image data will be reproduced as vertically-long images when viewed. That is, as shown in FIG. 12C, the reproduced images are stereo images rotated from the positions of the parallax images shown in FIG. 12B by 90 degrees to produce a parallax in the horizontal direction. In this case, these parallax images can be handled as right parallax image data Im_GR and left parallax image data Im_GL that are taken at a vertical angle of view and produce a parallax in the horizontal direction.

Figure 13:
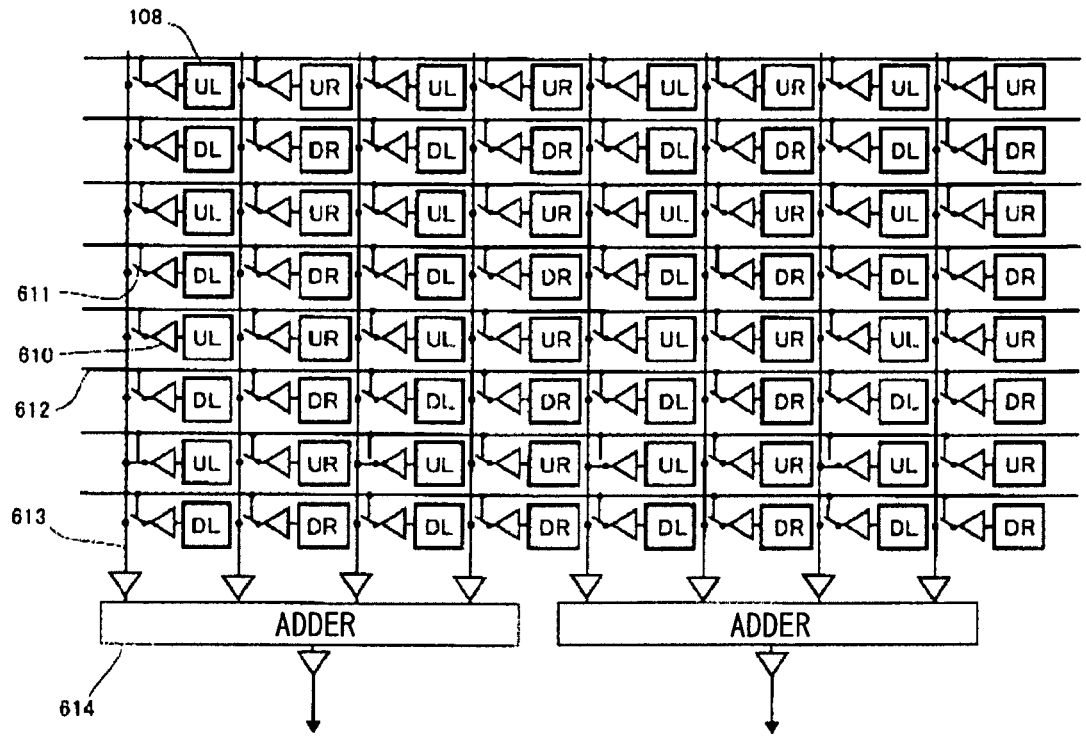
FIG. 13 is a concept diagram showing a circuit configuration of an image sensor.

FIG. 13 is a concept diagram showing the circuit configuration of the image sensor 100. The photoelectric converting elements 108 corresponding to UR pixels, DR pixels, DL pixels, and UR pixels are each connected to an amplifier 610. A gate switch 611 is connected to the output side of the amplifier 610, and the gate switch 611 is opened or closed in response to a selection control signal from a control line 612. When the gate switch 611 is closed, an amplified image signal is transmitted through a signal line 613 to arrive at an adder 614.

One gate switch 611 is closed to one signal line 613. For example, when generating the parallax image data Im_UR explained with reference to FIG. 10, only the image signals from the photoelectric converting elements 108 corresponding to the UR pixels are selected one by one by the selection control signal to be transferred sequentially to the signal lines 613, and with no addition applied by the adders 614, output to the A/D converter circuit 202. The selection control signal is transferred from the control section 201 through the driving section 204. The image signals digitalized by the A/D converter circuit 202 are transferred as image data to the image processing section 205, and the image processing section 205 converts the received image data to image data of a predetermined format to complete the parallax image data Im_UR. The parallax image data Im_DR, Im_DL, and Im_UL can also be generated in the same manner.

On the other hand, for example, when generating the parallax image data Im_GR explained with reference to FIG. 11, first, an image signal from a photoelectric converting element 108 corresponding to a UR pixel is selected by the selection control signal and transferred to the signal line 613. The adder 614 holds this UL image signal. Next, an image signal from a photoelectric converting element 108 corresponding to the paired DR pixel is selected by the selection control signal and transferred to the signal line 613. The adder 614 adds the transferred DR image signal to the held UR image signal and outputs the resulting image signal to the A/D converter circuit 202. This will be repeated for each pair of pixels. Also in this case, the selection control signal is transferred from the control section 201 through the driving section 204. The image signals digitalized by the A/D converter circuit 202 are transferred as image data to the image processing section 205, and the image processing section 205 converts the received image data to image data of a predetermined format to complete the parallax image data Im_GR. The parallax image data Im_GL can also be generated in the same manner.

For example; when generating the parallax image data Im_GU explained with reference to FIG. 12, first, an image signal from a photoelectric converting element 108 corresponding to an UR pixel is selected by the selection control signal and transferred to the signal line 613. The adder 614 holds this UR image signal. Next, an image signal from a photoelectric converting element 108 corresponding to the paired UL pixel is selected by the selection control signal and transferred to the signal line 613. The adder 614 adds the transferred UL image signal to the held UR image signal and outputs the resulting image signal to the A/D converter circuit 202. This will be repeated for each pair of pixels. Also in this case, the selection control signal is transferred from the control section 201 through the driving section 204. The image signals digitalized by the A/D converter circuit 202 are transferred as image data to the image processing section 205, and the image processing section 205 converts the received image data to image data of a predetermined format to complete the parallax image data Im_GU. The parallax image data Im_GD can also be generated in the same manner.

The control section 201 determines based on the posture of the digital camera 10 (hence, of the image sensor 100) detected by the posture sensor 222 whether to output the parallax image data as the combination of Im_GR and Im_GL or to output the parallax image data as the combination of Im_GU and Im_GD. That is, when the digital camera 10 is detected to be in the horizontally-long placement, the images to be output, which should be viewed at a horizontal angle of view, are the combination of the parallax image data Im_GR and Im_GL. On the other hand, when the digital camera 10 is detected to be in the vertically-long placement, the images to be output, which should be viewed at a vertical angle of view, are the combination of the parallax image data Im_GU and Im_GD. The control section 201 realizes the output based on these combinations by supplying a selection control signal to the control line 612 through the driving section 204.

Figure 14:
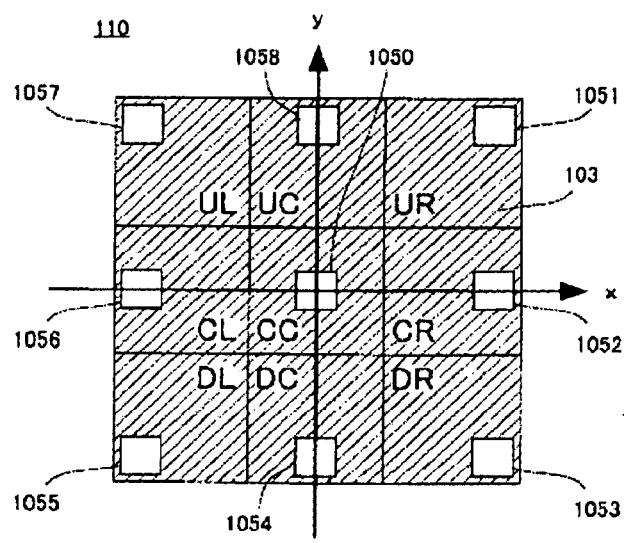
FIG. 14 is a diagram showing another example pixel arrangement of a repetition pattern including one photoelectric converting element group.

The pixel arrangement on the image sensor 100 according to the present embodiment is not limited to the pixel arrangement shown in FIG. 9 in which one repetition pattern 110 is constituted by four parallax pixels arranged in two rows vertically and in two columns horizontally. FIG. 14 is a diagram showing another example pixel arrangement of a repetition pattern 110 including one photoelectric converting element group. The image sensor 100 according to this example is provided with cyclically arranged repetition patterns 110 each including one photoelectric converting element group that includes nine parallax pixels arranged in three rows vertically and in three columns horizontally.

The nine parallax pixels include a UL pixel, a UC pixel, and a UL pixel arranged from the right to the left on an upper row of the repetition pattern 110, a CR pixel, a CC pixel, and a CL pixel arranged from the right to the left on a center row of the repetition pattern 110, and a DR pixel, a DC pixel, and a DL pixel arranged from the right to the left on a lower row of the repetition pattern 110. The UR pixel includes an aperture mask 103 having an aperture 1051 lopsided to the upper right from the pixel center. The CR pixel includes an aperture mask 103 having an aperture 1052 lopsided to the right from the pixel center. The DR pixel includes an aperture mask 103 having an aperture 1053 lopsided to the lower right from the pixel center. The DC pixel includes an aperture mask 103 having an aperture 1054 lopsided to the lower side from the pixel center. The DL pixel includes an aperture mask 103 having an aperture 1055 lopsided to the lower left from the pixel center. The CL pixel includes an aperture mask 103 having an aperture 1056 lopsided to the left from the pixel center. The UL pixel includes an aperture mask 103 having an aperture 1057 lopsided to the upper left from the pixel center. The UC pixel includes an aperture mask 103 having an aperture 1058 lopsided to the upper side from the pixel center. The CC pixel includes an aperture mask 103 having an aperture 1050 positioned at the pixel center.

The apertures 1050 to 1058 are located at positions axisymmetric to each other with respect to a x axis and a y axis defined as a horizontal axis and a vertical axis passing through the center of the repetition pattern 110. In other words, the apertures 1050 to 1058 are arranged lopsidedly to be axisymmetric to each other with respect to the vertical and horizontal two orthogonal axes defined on the two-dimensional arrangement of the photoelectric converting element group constituting the repetition pattern 110. That is, the group of apertures 1051, 1052, and 1053, are arranged at positions axisymmetric to each other with respect to the x axis, and so are the group of apertures 1058, 1050, and 1054, and the group of apertures 1057, 1056, and 1055. Further, the group of apertures 1057, 1058, and 1051 are arranged at positions axisymmetric to each other with respect to the Y axis, and so are the group of apertures 1056, 1050, and 1052, and the group of apertures 1055, 1054, and 1053.

FIG. 15 are concept diagrams explaining parallax pixel addition performed in the image sensor 100 shown in FIG. 14 to produce parallaxes in different directions. Nine pieces of parallax image data can be obtained when outputs from different kinds of apertures in the parallax pixels on the image sensor 100 are gathered separately. Further, parallax image data that will produce a parallax in the direction matching the visual characteristics can be obtained when the parallax pixel addition is performed according to the concepts explained with reference to FIG. 11 and FIG. 12.

Figure 15A:
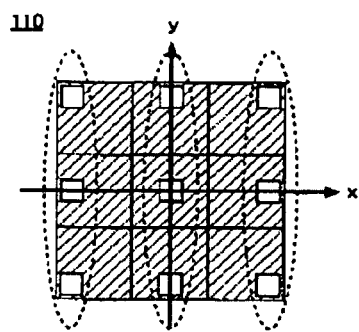
FIG. 15A is a concept diagram explaining parallax pixel addition to produce parallaxes in different directions.

FIG. 15A is a diagram showing the group of parallax pixels to be added by the parallax pixel addition to produce a parallax in the horizontal direction. When outputting parallax images that will produce parallaxes in the horizontal direction, the output of the UR pixel, the output of the CR pixel, and the output of the DR pixel are added, the output of the UC pixel, the output of the CC pixel, and the output of the DC pixel are added, and the output of the UL pixel, the output of the CL pixel, and the output of the DL pixel are added. That is, the combination of the UR pixel, the CR pixel, and the DR pixel, the combination of the UC pixel, the CC pixel, and the DC pixel, and the combination of the UL pixel, the CL pixel, and the DL pixel are handled as pixel groups, respectively.

When the results of addition of outputs obtained in different kinds of pixel groups, each of which is regarded as if it were an output from one right parallax pixel, one center parallax pixel, or one left parallax pixel, are gathered separately and interpolation for aspect adjustment is applied, right parallax image data Im_GR, center parallax image data Im_GC, and left parallax image data Im_GL representing images that will produce parallaxes in the horizontal direction can be obtained. When the user takes a photo by holding the digital camera 10 at a horizontal angle of view and such parallax image data are generated, the images to be reproduced at the horizontal angle of view are three parallax images that produce parallaxes in the horizontal direction. Although the apertures 1058, 1050, and 1054 in the UC pixel, the CC pixel, and the DC pixel are not lopsided to the left or the right, they are also handled as parallax pixels (center parallax pixels) because they guide partial fluxes of light from partial regions to the photoelectric converting elements 108.

Figure 15B:
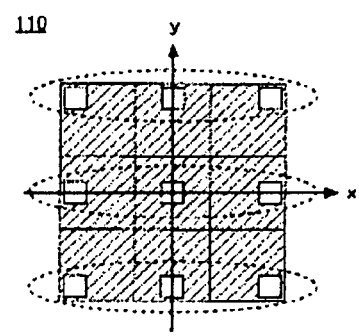
FIG. 15B is a concept diagram explaining parallax pixel addition to produce parallaxes in different directions.

FIG. 15B is a diagram showing the group of parallax pixels to be added by the parallax pixel addition to produce a parallax in the vertical direction. When outputting parallax images that will produce parallaxes in the vertical direction, the output of the UL pixel, the output of the UC pixel, and the output of the UR pixel are added, the output of the CL pixel, the output of the CC pixel, and the output of the CR pixel are added, and the output of the DL pixel, the output of the DC pixel, and the output of the DR pixel are added. When the user takes a photo by holding the digital camera 10 at a vertical angle of view and such parallax image data are generated, the images to be reproduced at the vertical angle of view are three parallax images that produce parallaxes in the vertical direction. Although the apertures 1056, 1050, and 1052 of the LC pixel, the CC pixel, and the RC pixel are not lopsided to the upper or the lower side, they are also handled as parallax pixels because they guide partial fluxes of light from partial regions to the photoelectric converting elements 108.

Figure 15C:
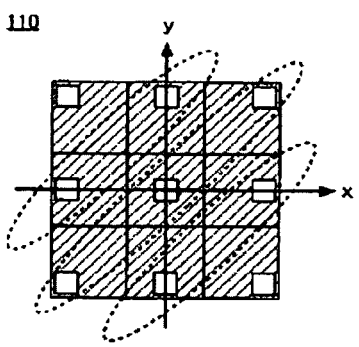
FIG. 15C is a concept diagram explaining parallax pixel addition to produce parallaxes in different directions.
Figure 15D:
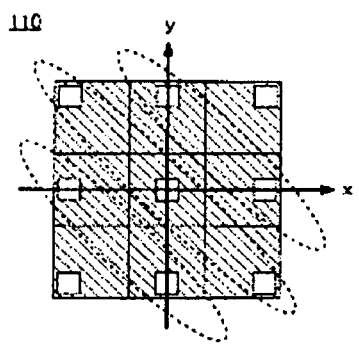
FIG. 15D is a concept diagram explaining parallax pixel addition to produce parallaxes in different directions.

In this arrangement, parallax pixel addition to produce parallaxes in a diagonal direction is also available. FIG. 15C and FIG. 15D are diagrams showing the groups of parallax pixels to be added by parallax pixel addition to produce parallaxes in a diagonal direction. In this case, because the center pixel group is a combination of three parallax pixels whereas the pixel groups on both sides are each a combination of two parallax pixels, a process for adjusting the luminance value of an image signal resulting from addition will be applied.

In the above explanation, the image sensor 100 is assumed to be an image sensing device composed only of parallax pixels including color filters 102 of the same color (including a case when the filters are transparent). However, when the image sensor 100 is a color image sensing device having the structure shown in FIG. 2, the structure of the image sensor 100 includes parallax pixels and non-parallax pixels in a mix, with color filter patterns and repetition patterns 110 combined. A specific example of this will be described below.

Figure 16:
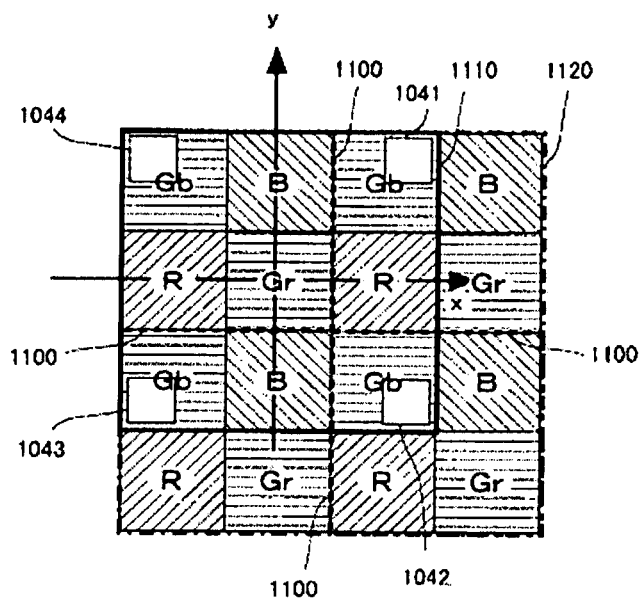
FIG. 16 is a diagram explaining an example combination of color filter patterns and repetition patterns.

FIG. 16 is a diagram explaining an example combination of color filter patterns 1100 and repetition patterns 1110. The explanation here will be given based on an example in which the UR pixel, the DR pixel, the DL pixel, and the UL pixel shown in FIG. 9 are combined with color filter patterns 1100.

A color filter pattern 1100 to be employed here is of a Bayer arrangement. In a Bayer arrangement, green filters are allocated to two pixels on the upper left and lower right, a red filter is allocated to one pixel at the lower left, and a blue filter is allocated to one pixel on the upper right. Here, the pixel on the upper left to which a green filter is allocated is referred to as a Gb pixel, and the pixel on the lower right to which a green filter is likewise allocated is referred to as a Gr pixel. Further, the pixel to which a red filter is allocated is referred to as a R pixel, and the pixel to which a blue filter is allocated is referred to as a B pixel.

All of the UR pixel, the DR pixel, the DL pixel, and the UL pixel, which are parallax pixels, are Gb pixels. Specifically, the UR pixel is arranged to come at the Gb pixel of a color filter pattern 1100 on the upper right, the DR pixel is arranged to come at the Gb pixel of a color filter pattern 1100 at the lower right, the DL pixel is arranged to come at the Gb pixel of a color filter pattern 1100 at the lower left, and the UL pixel is arranged to come at the Gb pixel of a color filter pattern 1100 at the upper left. Hence, a cyclic pattern 1120 composed of four color filter patterns 1100 arranged at the upper right, lower right, lower left, and upper left is the minimum cycle unit for the combination of color filters and parallax pixels.

Also in the repetition pattern 1110 of this case, the included apertures 1041 to 1044 are arranged at positions axisymmetric to each other with respect to each of an x axis and a y axis defined as a horizontal axis and a vertical axis passing the center of the repetition pattern 1110. Therefore, when these pixels are added, such parallax images described above can be output.

When non-parallax pixels are gathered from this arrangement of the image sensor 100, a 2D image can be generated. However, since the Gb pixels are parallax pixels, the pixel values of the Gb pixels to form empty lattice points in the 2D image data are interpolated by the pixel values of the Gr pixels. The color filter pattern 1100 needs not be of a Bayer arrangement, and the Gb pixels may be changed to W pixels to which no color filter is allocated. A non-colored transparent filter may be arranged in a W pixel to allow substantially all wavelength bands of the visible light to transmit.

In the embodiment described above, pixel addition can be performed by using analog signals because the image sensor 100 is provided with the control line 612 and the adders 614. However, even a digital camera 10 incorporating an image sensor 100 including no adders 614 can, by applying an image process to image data to be output, perform pixel addition digitally and newly generate parallax image data.

Such a process may be performed self-contained by the digital camera 10 by the control section 201 and the image processing section 205 working in cooperation, or may be performed by an external apparatus such as a personal computer. In this case, the digital camera 10 and the external apparatus such as a personal computer function as an image processing device.

When performing such a post-processing, a personal computer or the like functioning as an image processing device includes an output image data acquiring section that acquires output image data formed by electric signals output from the image sensor 100, an aperture information acquiring section that acquires aperture position information regarding the positions of the apertures 104 of the image sensor 100, and a parallax image data generating section that generates parallax image data by processing the output image data by referring to the aperture information.

When seen in a personal computer, the output image data acquiring section is equivalent to an external communication unit, a memory card reading unit, etc. The output image data acquiring section acquires, for example, the parallax image data Im_UR, Im_DR, Im_DL, and Im_UL shown in FIG. 10B, to which no addition process is applied. The aperture information acquiring section may share these units or may be a separate acquiring section, where data reception is concerned. The aperture information is, for example, information describing the kinds and positions of the parallax pixels, such as which pixel is a UR pixel, etc. The parallax image data generating section applies addition processes to the pixels from, for example, the parallax image data Im_UR, Im_DR, Im_DL, and Im_UL according to the aperture information to generate at least either parallax image data Im_GR and Im_GL or parallax image data Im_GU and Im_GD.

In this case, the parallax image data generating section can determine which type of parallax image data to generate based on various kinds of information. For example, if the image processing device includes an acquiring section for acquiring posture information of the image sensor 100 of when it outputted an image signal, the parallax image data generating section can determine whether to generate parallax image data as the combination of Im_GR and Im_GL or to generate parallax image data as the combination of Im_GU and Im_GD according to the posture information.

If the image processing device includes a depth map generating section that generates a depth map showing depth information of an object by processing, for example, the parallax image data Im_UR, Im_DR, Im_DL, and Im_UL, the parallax image data generating section may determine based on the generated depth map which type of parallax image data to generate. For example, the parallax image data generating section searches for a boundary at which the maximum depth difference appears, and generates parallax image data that will produce a parallax in a direction perpendicular to that boundary Instead of acquiring output signals from the image sensor 100 divisionally by the unit of parallax image data, the parallax image data generating section may acquire RAW image data indicating the pixel values as they are on the pixel arrangement and determine which type of parallax image data to generate by referring to the pixel values of the parallax pixels included in that data. Specifically, the parallax image data generating section calculates the difference between the pixel values of adjoining parallax pixels, searches for a direction in which this difference is maximum statistically, and generates parallax image data that will produce a parallax in this direction.

In the embodiment described above, the apertures are arranged at positions axisymmetric to each other with respect to an x axis and a y axis defined as a horizontal axis and a vertical axis passing the center of the repetition pattern 110. In other words, the apertures are arranged lopsidedly to be axisymmetric to each other with respect to the vertical and horizontal two orthogonal axes defined on the two-dimensional arrangement of the photoelectric converting element group constituting the repetition pattern 110. However, even if two axes are not directly defined on the two-dimensional arrangement of the photoelectric converting element group constituting the repetition pattern 110, it is possible to obtain parallax image data that will produce a parallax in the direction that matches the visual characteristics as done by the image sensor described above, provided that the image sensor has the following aperture lopsided configuration.

Figure 17:
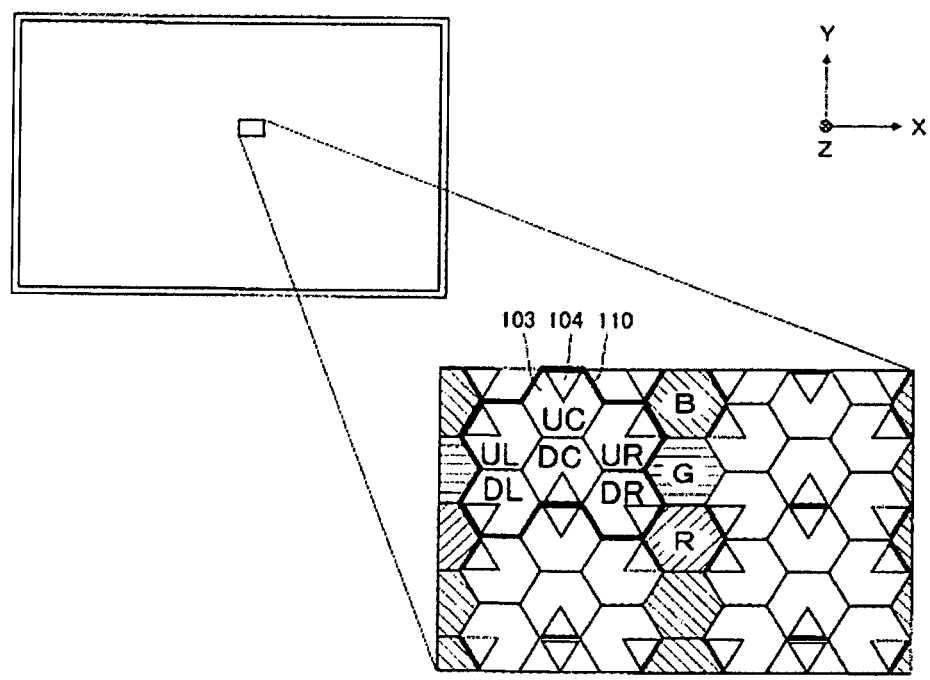
FIG. 17 is a schematic diagram showing an enlarged view of a portion of another image sensor.

FIG. 17 is a schematic diagram showing an enlarged view of a portion of another image sensor 1200. The image sensor 1200 is an image sensor having a so-called honeycomb configuration in which the pixels are arranged in a hexagonal closest packed lattice. As shown in the drawing, adjoining six pixels are defined as parallax images that constitute a repetition pattern 110. The six parallax pixels include an UR pixel, an UC pixel, and an UL pixel arranged on an upper row from the right to the left in the repetition pattern 110, and a DR pixel, a DC pixel, and a DL pixel arranged on a lower row from the right to the left in the repetition pattern 110.

The UR pixel includes an aperture mask 103 having a triangular aperture 104 lopsided to the upper right from the pixel center. The DR pixel includes an aperture mask 103 having a triangular aperture 104 lopsided to the lower right from the pixel center. The DC pixel includes an aperture mask 103 having a triangular aperture 104 lopsided to the lower side from the pixel center. The DL pixel includes an aperture mask 103 having a triangular aperture 104 lopsided to the lower left from the pixel center. The UL pixel includes an aperture mask 103 having a triangular aperture 104 lopsided to the upper left from the pixel center. The UC pixel includes an aperture mask 103 having a triangular aperture 104 lopsided to the upper side from the pixel center.

Color filters are provided on non-parallax pixels that adjoin the parallax pixels constituting the repetition pattern 110. As shown in the drawing, a B pixel to which a blue filter is allocated, a G pixel to which a green filter is allocated, and a R pixel to which a red pixel is allocated are arranged to adjoin vertically.

Figure 18A:
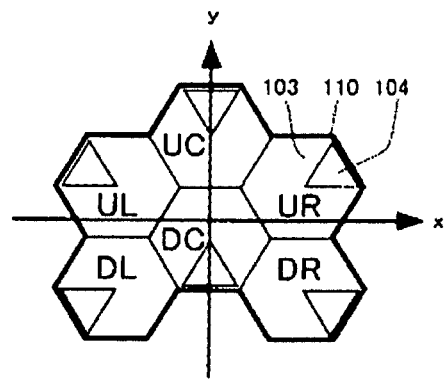
FIG. 18A is a diagram showing a repetition pattern including one photoelectric converting element group.

FIG. 18 are diagrams showing the repetition pattern 110 including one photoelectric element group. Particularly, FIG. 18A is a diagram showing one extracted repetition pattern 110. As shown in the drawing, when orthogonal x and y axes are defined on the two-dimensional array of the photoelectric converting element group constituting the repetition pattern 110, the apertures are axisymmetric to each other with respect to the y axis, but not axisymmetric to each other with respect to the x axis. That is, as the pixels are arranged in a hexagonal closest packed lattice, the UC pixel and the DC pixel are staggered from the adjoining pixels on both sides in the y axis direction by half a pixel, to spoil the axisymmetricity with respect to the x axis.

Figure 18B:
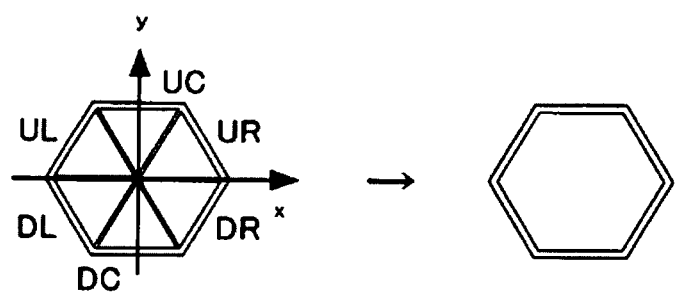
FIG. 18B is a diagram showing a repetition pattern including one photoelectric converting element group.

However, when the apertures are imaginarily brought upon one photoelectric element with their positions with respect to their corresponding photoelectric converting elements maintained as shown in FIG. 18B, the apertures can be said to be positioned lopsidedly to be axysimmetric to each other with respect to the orthogonal x and y axes defined on this imaginary photoelectric converting element. It is preferable that the whole shape of these gathered apertures be substantially the same as the aperture of a non-parallax pixel, as shown on the right-hand side of FIG. 18B. That is, it is preferable that each aperture be ⅙ the size of the aperture of a non-parallax pixel. Note that the apertures of the parallax pixels constituting the repetition pattern 110 are positioned to let through fluxes of light from different partial regions of the cross-sectional region of incident light respectively, as in the image sensor described above.

FIG. 19 are concept diagrams explaining parallax pixel addition performed in the image sensor 1200 to produce parallaxes in different directions. Six pieces of parallax image data can be obtained when the outputs from different kinds of apertures of the parallax pixels of the image sensor 1200 are gathered separately. Further, parallax image data that will produce parallaxes in the direction matching the visual characteristics can be obtained when the parallax pixel addition is performed according to the concepts explained with reference to FIG. 11 and FIG. 12.

Figure 19A:
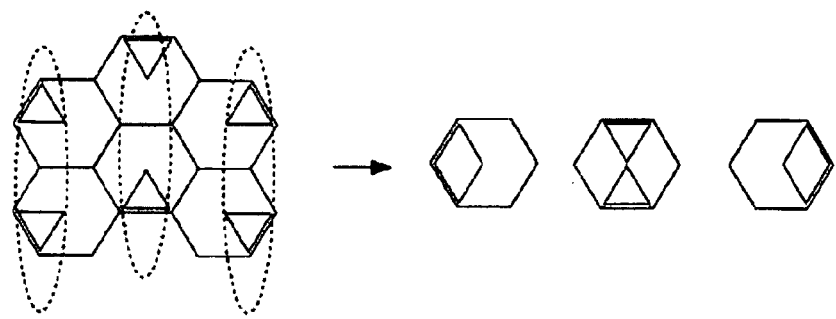
FIG. 19A is a concept diagram explaining parallax pixel addition to produce parallaxes in different directions.

FIG. 19A is a diagram showing the groups of parallax pixels to be added by parallax pixel addition to produce parallaxes in the horizontal direction. When outputting parallax images that will produce parallaxes in the horizontal direction, the output from the UR pixel and the output from the DR pixel are added, the output from the UC pixel and the output from the DC pixel are added, and the output from the UL pixel and the output from the DL pixel are added. That is, the combination of the UR pixel and the DR pixel, the combination of the UC pixel and the DC pixel, and the combination of the UL pixel and the DL pixel are handled as pixel groups respectively.

When the results of addition of outputs obtained in different kinds of pixel groups, each of which is regarded as if it were an output from one right parallax pixel, one center parallax pixel, or one left parallax pixel, are gathered separately and interpolation for aspect adjustment is applied, right parallax image data Im_GR, center parallax image data Im_GC, and left parallax image data Im_GL representing images that will produce parallaxes in the horizontal direction can be obtained. When the user takes a photo by holding the digital camera 10 at a horizontal angle of view and such parallax image data are generated, the images to be reproduced at the horizontal angle of view are three parallax images that produce parallaxes in the horizontal direction.

Figure 19B:
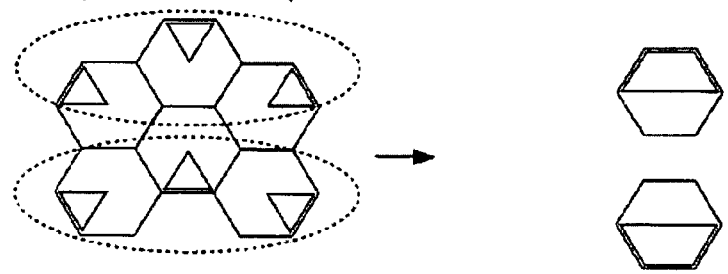
FIG. 19B is a concept diagram explaining parallax pixel addition to produce parallaxes in different directions.

FIG. 19B is a diagram showing the groups of parallax pixels to be added by parallax pixel addition to produce parallaxes in the vertical direction. When outputting parallax images that will produce parallaxes in the vertical direction, the output from the UL pixel, the output from the UC pixel, and the output from the UR pixel are added, and the output from the DL pixel, the output from the DC pixel, and the output from the DR pixel are added. When the user takes a photo by holding the digital camera 10 at a vertical angle of view and such parallax image data are generated, the images to be reproduced at the vertical angle of view are two parallax images that will produce a parallax in the vertical direction.

Figure 19C:
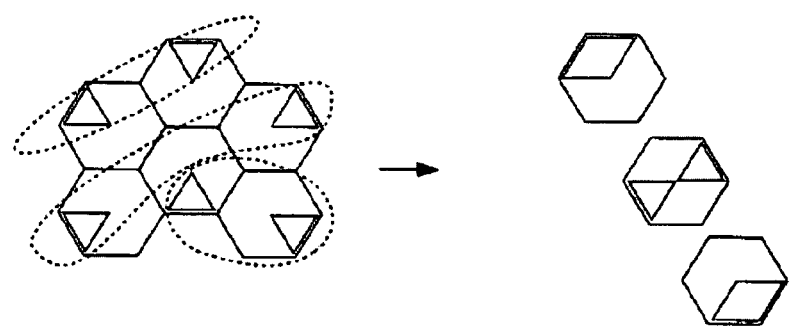
FIG. 19C is a concept diagram explaining parallax pixel addition to produce parallaxes in different directions.
Figure 19D:
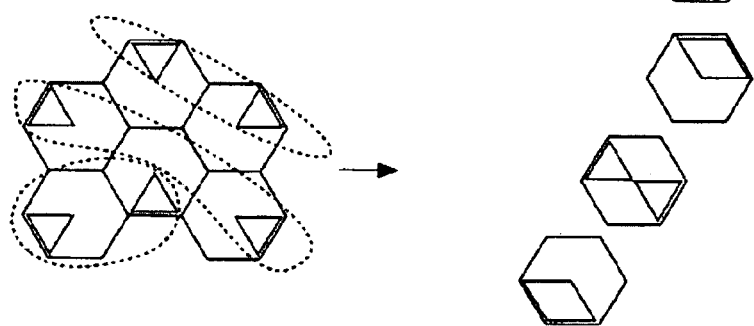
FIG. 19D is a concept diagram explaining parallax pixel addition to produce parallaxes in different directions.

In this arrangement, parallax pixel addition to produce parallaxes in a diagonal direction is also available. FIG. 19C and FIG. 19D are diagrams showing the groups of parallax pixels to be added by parallax pixel addition to produce parallaxes in a diagonal direction.

In the image sensor 1200 having the honeycomb configuration described above, color filters are allocated to non-parallax pixels, but color filters may be allocated to parallax pixels. Further, color filters of a given color may be allocated to non-parallax pixels and color filters of another color may be allocated to parallax pixels.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCE NUMERALS 10 digital camera
20 image capturing lens
21 optical axis
30 object
100 image sensor
101 micro-lens
102 color filter
103 aperture mask
104 aperture
105 interconnection layer
106 interconnection line
107 aperture
108 photoelectric converting element
109 substrate
110 repetition pattern
120 image sensor
121 screen filter
122 color filter portion
123 aperture mask portion
201 control section
202 A/D converter circuit
203 memory
204 driving section
205 image processing section
207 memory card If
208 operation section
209 display section
210 LCD driving circuit
211 AF sensor
220 memory card
610 amplifier
611 gate switch
612 control line
613 signal line
614 adder
800, 900 image sensor
1041, 1042, 1043, 1044, 1050, 1051, 1052, 1053, 1054, 1055, 1056, 1057, 1058 aperture
1100 color filter pattern
1101 GR aperture
1102 GL aperture
1103 GU aperture
1104 GD aperture
1110 repetition pattern
1120 cyclic pattern
1200 image sensor

What is claimed is:
1. An image sensor, comprising:
photoelectric converting elements that are arranged two-dimensionally and photoelectrically convert incident light to electric signals, respectively; and
aperture masks provided on the photoelectric converting elements, wherein
photoelectric converting element groups each including n photoelectric converting elements out of the photoelectric converting elements are arranged cyclically, where n is an integer equal to or larger than 4,
apertures in the aperture masks are positioned lopsidedly to be axisymmetric to each other with respect to each of two orthogonal axes defined on two-dimensional arrangement of each photoelectric converting element group,
the image sensor further comprises:
a selecting circuit that selects from each photoelectric converting element group, mutually pertinent at least two photoelectric converting elements of the photoelectric converting elements; and
an adder that, for each photoelectric converting element group, adds the electric signals from the at least two photoelectric converting elements selected by the selecting circuit, and
the selecting circuit selects at least two of the photoelectric converting elements provided with the aperture masks such that the apertures are axisymmetric with respect to one of the two axes.
2. An image sensor, comprising:
photoelectric converting elements that are arranged two-dimensionally and photoelectrically convert incident light to electric signals, respectively; and
aperture masks provided on the photoelectric converting elements, wherein
photoelectric converting element groups each including n photoelectric converting elements out of the photoelec- tric converting elements are arranged cyclically, where n is an integer equal to or larger than 4, apertures in the aperture masks, when imaginarily brought upon one photoelectric converting element with their positions with respect to corresponding ones of the photoelectric converting elements maintained, are positioned lopsidedly to be axisymmetric to each other with respect to each of two orthogonal axes defined on the photoelectric converting element provided imaginarily, the image sensor further comprises:

a selecting circuit that selects from each photoelectric converting element group, mutually pertinent at least two photoelectric converting elements of the photoelectric converting elements; and an adder that, for each photoelectric converting element group, adds the electric signals from the at least two photoelectric converting elements selected by the selecting circuit, and the selecting circuit selects at least two of the photoelectric converting elements for which the apertures in the respective aperture masks of the photoelectric converting elements are arranged lopsidedly in different directions.

3. The image sensor according to claim 1, wherein the apertures in the aperture masks are positioned so as to let through fluxes of light from different partial regions provided in a cross-sectional region of the incident light, respectively.

4. An imaging device, comprising:
the image sensor according to claim 1;
a posture detecting section that detects a posture of the image sensor;
a control section that, based on the posture detected by the posture detecting section, controls the selecting circuit to select specific ones of the photoelectric converting elements, and controls the adder to add the electric signals from the specific photoelectric converting elements; and an image processing section that processes image signals output from the adder of the image sensor.

5. An image processing device, comprising:
an output image data acquiring section that acquires output image data that is based on the electric signals output from the image sensor according to claim 1;
an aperture information acquiring section that acquires aperture position information regarding positions of the apertures of the image sensor; and
a parallax image data generating section that generates parallax image data by processing the output image data based on the aperture position information.

6. The image processing device according to claim 5, wherein
the parallax image data generating section generates the parallax image data by, based on the aperture position information, adding pixel values of mutually pertinent at least two pixels among pixels that are included in the output image data and correspond to each photoelectric converting element group.

7. The image processing device according to claim 6, comprising a depth map generating section that generates a depth map indicating depth information of an object by processing the output image data, wherein
the parallax image data generating section selects the at least two pixels based on the depth map.

8. The image processing device according to claim 6, wherein
the parallax image data generating section selects the at least two pixels based on a difference between pixel values of adjoining pixels.

9. The image processing device according to claim 6, comprising a posture information acquiring section that acquires posture information regarding a posture of the image sensor of when the image sensor outputted the electric signals, wherein
the parallax image data generating section selects the at least two pixels based on the posture information.

* * * * *